United States Patent
Suzuki et al.

(10) Patent No.: US 8,877,584 B2
(45) Date of Patent: Nov. 4, 2014

(54) METHOD OF MANUFACTURING INTERCONNECTION MEMBER AND ELECTRONIC DEVICE

(75) Inventors: Koei Suzuki, Kanagawa (JP); Haruo Nakamura, Tokyo (JP); Atsushi Onodera, Tokyo (JP); Takanori Tano, Chiba (JP); Hiroshi Miura, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 169 days.

(21) Appl. No.: 13/477,245

(22) Filed: May 22, 2012

(65) Prior Publication Data

US 2012/0312583 A1    Dec. 13, 2012

(30) Foreign Application Priority Data

Jun. 9, 2011 (JP) ................................. 2011-129489
Feb. 6, 2012 (JP) ................................. 2012-023116

(51) Int. Cl.
*H01L 21/336* (2006.01)

(52) U.S. Cl.
USPC ...... 438/257; 438/258; 438/593; 438/E21.412

(58) Field of Classification Search
CPC .............. H01L 51/0022; H01L 51/052; H01L 51/0545; H01L 51/055
USPC ................. 438/637–638, 672–673, 612–624; 257/40, 57, 59, 79, 779, E21.412
See application file for complete search history.

(56) References Cited

U.S. PATENT DOCUMENTS

| | | | |
|---|---|---|---|
| 7,199,033 B2 | 4/2007 | Hirai et al. | |
| 7,485,576 B2 | 2/2009 | Suh et al. | |
| 7,612,455 B2 * | 11/2009 | Tano et al. | 257/779 |
| 7,749,684 B2 * | 7/2010 | Kobayashi | 430/311 |
| 7,816,672 B2 | 10/2010 | Tomono et al. | |
| 8,003,533 B2 | 8/2011 | Onodera et al. | |
| 8,049,211 B2 | 11/2011 | Tano et al. | |
| 2005/0022374 A1 | 2/2005 | Hirai et al. | |
| 2006/0286704 A1 | 12/2006 | Hirai et al. | |
| 2007/0096088 A1 | 5/2007 | Tano et al. | |
| 2009/0232969 A1 | 9/2009 | Hayton et al. | |
| 2009/0261320 A1 | 10/2009 | Tano et al. | |

(Continued)

FOREIGN PATENT DOCUMENTS

| | | |
|---|---|---|
| JP | 2005-12181 | 1/2005 |
| JP | 2005-310962 | 11/2005 |

(Continued)

OTHER PUBLICATIONS

European search report dated Oct. 11, 2012 in connection with corresponding European patent application No. 12170374.8.

*Primary Examiner* — Dung A. Le
(74) *Attorney, Agent, or Firm* — Cooper & Dunham LLP

(57) ABSTRACT

A method of manufacturing an interconnection member includes forming on a substrate a wettability changing layer containing a material in which critical surface tension is changed by giving energy; forming a depression part in the wettability changing layer by a laser ablation method using a laser of an ultraviolet region; and coating the depression part with an electrically conductive ink to form an electrically conductive part. At the same time when a pattern of the depression part is formed in the wettability changing layer, a pattern of a high surface energy area is formed as a result of the critical surface tension being changed.

5 Claims, 15 Drawing Sheets

(56) References Cited

U.S. PATENT DOCUMENTS

| | | |
|---|---|---|
| 2009/0278138 A1 | 11/2009 | Suzuki et al. |
| 2010/0181571 A1* | 7/2010 | Tano et al. .................. 257/59 |
| 2010/0189436 A1 | 7/2010 | Nakagawa et al. |
| 2010/0297456 A1 | 11/2010 | Tano et al. |
| 2010/0308321 A1 | 12/2010 | Tano et al. |
| 2011/0215336 A1 | 9/2011 | Onodera et al. |
| 2011/0266549 A1 | 11/2011 | Onodera et al. |

FOREIGN PATENT DOCUMENTS

| | | |
|---|---|---|
| JP | 2006-163418 | 6/2006 |
| JP | 2009-26901 | 2/2009 |
| JP | 2009-105413 | 5/2009 |
| JP | 2009-188259 | 8/2009 |
| WO | WO2006/061589 | 6/2006 |
| WO | WO2009/011445 | 1/2009 |
| WO | WO2009/099227 | 8/2009 |
| WO | WO2010/034815 | 4/2010 |

* cited by examiner

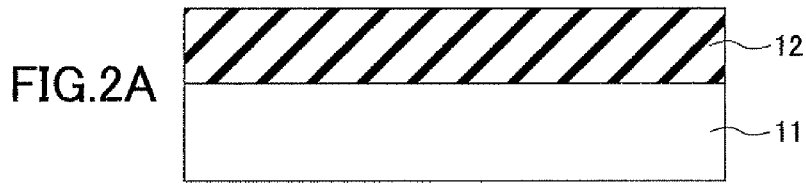
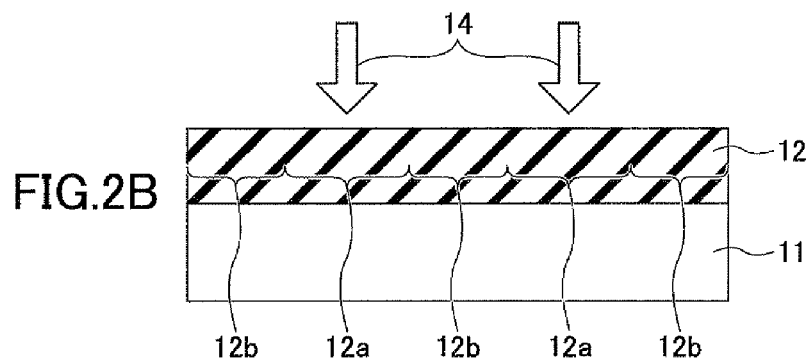
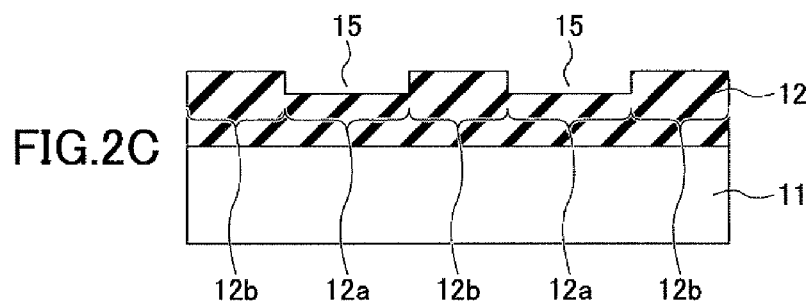
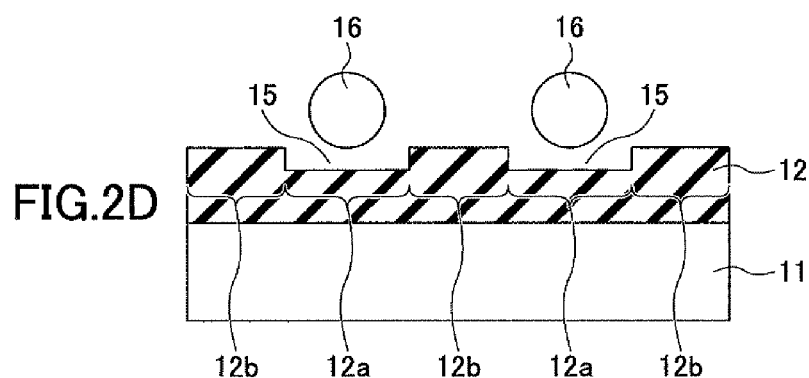
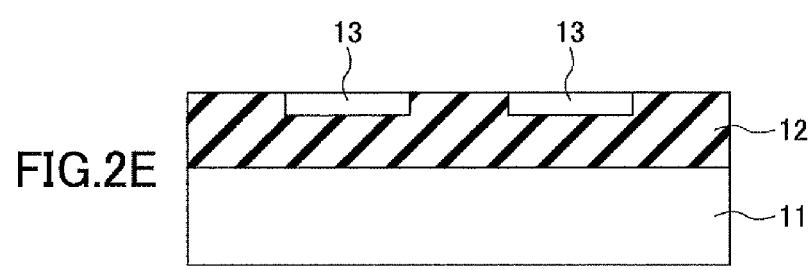

METHOD OF MANUFACTURING INTERCONNECTION MEMBER AND ELECTRONIC DEVICE

BACKGROUND OF THE INVENTION

1. Field of the Invention

The present invention relates to a method of manufacturing an interconnection member and an electronic device, and an interconnection member, multilayered interconnections, an electronic device, electronic device array and a display device using the method.

2. Description of the Related Art

In the related art, photolithography is used to form interconnections, electrodes or the like used in a semiconductor device, an electronic circuit or the like. Photolithography may require expensive equipment since exposure equipment having high accuracy represented by a vacuum device or a stepper is used. Further, the processes may be complicated, the number of processes may be numerous, also the efficiency of utilization of material may be low, and therefore, the manufacturing costs may be high. Thus, photolithography may involve problems.

As a method of reducing the manufacturing costs, a printed electronics technique attracts attention. This is a technique of forming an electrically conductive pattern by directly printing with a functional ink or paste represented by metal fine particles on a base material. Methods of using various printing methods have been proposed therefor.

As a specific example of the printed electronics technology, a patterning method using an inkjet method (liquid droplet discharging method) may be cited. This is a method of directly coating a substrate with a liquid (ink), in which fine particles are dispersed, by an inkjet method, after that, carrying out a curing process by a heat treatment or laser light irradiation, and thus, forming an electrically conductive film pattern. This method is advantageous in that the processes are simplified, also the efficiency of utilization of material is improved, such a material used only for patterning as photoresist used in photolithography is not needed, and the manufacturing costs can be reduced.

However, in an inkjet method in the related art, since discharged liquid droplets may spread after they land, it may be difficult to form a fine pattern, and thus, it may be difficult to respond to a recent request to increase the density of devices, and increase the density and/or miniaturization of interconnections and/or electrodes therefor.

Further, it has been known that in an inkjet method in the related art, a so-called "coffee stain phenomenon" may occur in which a pattern edge part becomes thicker than a pattern center part. Therefore, there may be a problem in which an insulation failure occurs when multilayered interconnections are formed with an upper layer via an insulating film or an electrode of a thin film transistor is formed in an upper layer via a gate insulating film.

In order to solve the problems, various studies have been carried out.

Japanese Laid-Open Patent Application No. 2005-012181 (Patent reference No. 1) discusses a method of providing a bank for defining an area to form an interconnection, and increasing hydrophilicity of a substrate surface part which will be coated with a functional liquid while carrying out a water repellent finish on the bank surface. According to this method, the functional liquid including an interconnection pattern ink is discharged to the area enclosed by the bank and having the increased hydrophilicity, and thus, it is possible to form an interconnection pattern having a width narrower than a diameter of the discharged ink droplet.

However, in this method, many processes may be needed such as a bank forming process, a hydrophilicity increasing process, a water repellency providing process, and so forth. Further, also a vacuum process may be needed. Thus, the advantageous effect of reducing the number of processes of an inkjet method may be lost.

On the other hand, Japanese Laid-Open Patent Application No. 2006-163418 (Patent reference No. 2) and Japanese Laid-Open Patent Application No. 2009-105413 (Patent reference No. 3) discuss methods of forming a depression part having a shape of an electrically conductive pattern in a base member by a laser ablation method or etching, coating the depression part with an electrically conductive material and thus, forming the electrically conductive pattern, or thus forming a thin film transistor.

However, when the depression part is formed by etching, it may be difficult to form a fine pattern since line width and depth are controlled by controlling a liquid dropping amount and a surface treatment. Further, since wet etching is used, this method may have a problem in the efficiency and/or the pattern controllability.

On the other hand, in a case where the depression part is formed by a laser ablation method, it is possible to obtain a width of the depression part thus formed, from a wide pattern through a fine pattern, and the efficiency is relatively high. However, in a case where a laser ablation method is used to work a base material made of a plastic substrate or an insulating film, and a surface treatment is carried out, a residue may be generated on the surface of the base member. Further, concerning depth control in a laser ablation method, since pulsed laser light is used for scanning, a variation may occur in depth, and thus, depth control may involve a problem.

The inventors of the present patent application and so forth previously proposed in Japanese Laid-Open Patent Application No. 2005-310962 (Patent reference No. 4) a laminated structure for which a printing method can be applied and a fine pattern can be easily formed, using a wettability changing material in which critical surface tension is changed by giving energy thereto. In the technology of Patent reference No. 4, first a high surface energy area and a low surface energy area are formed by carrying out one-shot exposure using a photo mask on a wettability changing layer on a substrate surface. Next, a pattern is formed by dropping a hydrophilic ink on the high surface energy area by an inkjet method. In this method, it is possible to form a fine pattern merely by adding a single exposure process in comparison to an ordinary inkjet printing. However, in this method, since a surface to form an electrically conductive pattern is approximately a flat surface, a defect may be generated in an electrically conductive pattern in a case of forming a very fine pattern, and thus, a further improvement may be needed.

Further, Japanese Laid-Open Patent Application No. 2009-026901 (Patent reference No. 5) discusses that a depression part is formed by a reduction in film thickness by 5 nm or more, 10% or less of the film thickness of a wettability controlling film through ultraviolet irradiation. However, a change in surface energy and the depth of the depression part are controlled by controlling an ultraviolet irradiation amount. Therefore, it may be difficult to control both the surface energy and the depth of the depression part to the respective target values simultaneously, since the surface energy may be changed on the order of the target amount merely by irradiation of a small amount of ultraviolet rays whereas a long time of ultraviolet irradiation is needed to form a deep depression part.

SUMMARY OF THE INVENTION

According to one aspect of the present invention, a method of manufacturing an interconnection member includes forming a wettability changing layer, including a material in which critical surface tension is changed by giving energy, onto a substrate; forming a depression part in the wettability changing layer by a laser ablation method using a laser of an ultraviolet region; and coating the depression part with an electrically conductive ink to form an electrically conductive part. In the method, at the same time when a pattern of the depression part is formed in the wettability changing layer, a pattern of a high surface energy area is formed as a result of the critical surface tension being changed.

Other objects, features and advantages of the present invention will become more apparent from the following detailed description when read in conjunction with the accompanying drawings.

BRIEF DESCRIPTION OF THE DRAWINGS

FIGS. 2A, 2B, 2C, 2D and 2E illustrate a method of manufacturing an interconnection member according to an embodiment 1 of the present invention;

DETAILED DESCRIPTION OF THE EMBODIMENTS

Embodiments of the present invention have been devised in consideration of the above-mentioned problems, and an object of the embodiments is to provide a method of manufacturing an interconnection member that is finer, has no reduction in insulating properties, and has high accuracy in line width and thickness of an electrically conductive part, while taking advantage of the small number of processes thanks to applying printing.

According to the embodiments, a depression part is formed in a wettability changing layer, for forming an electrically conductive part, by a laser ablation method using a laser of an ultraviolet region. Therefore, the depression part to which laser light is irradiated is changed in its wettability, and it will be possible to dispose an electrically conductive ink only in the depression part when the depression part is coated with the electrically conductive ink is coated. Further, since the forming of the depression part and the changing the wettability can be carried out in the same process, it is possible to reduce an increase in the number of processes, and form an interconnection member having no reduction in insulating properties, while taking advantage of the small number of processes thanks to applying printing.

Below, using drawings, the embodiments of the present invention will be described. However, embodiments of the present invention are not limited to thereto.

Figure 1:
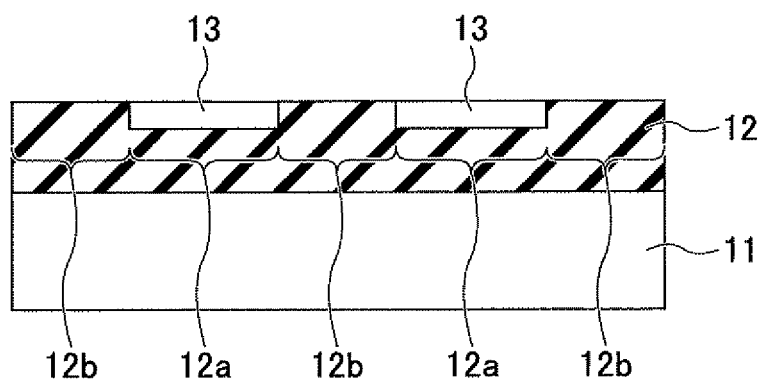
FIG. 1 illustrates an interconnection member according to an embodiment of the present invention.

FIG. 1 is a sectional schematic view of one example of an interconnection member according to an embodiment of the present invention. As shown in FIG. 1, a substrate 11 and a wettability changing layer 12 on the substrate 11 are provided. The wettability changing layer 12 contains a material in which critical surface tension is changed as a result of energy being given thereto. Further, electrically conductive parts 13 are formed in the wettability changing layer 12. The electrically conductive parts 13 are formed in depression parts previously formed in the wettability changing layer 12.

The respective members will be described below.

The substrate 11 is not particularly limited as long as it is possible to form, using the substrate, electrically conductive parts, an electronic device, an electronic device array and a display device. For example, as the substrate 11, a glass substrate, a film substrate or the like may be used. As the film substrate, a polyimide (PI) substrate, a polyethersulfone (PES) substrate, a polyethylene terephthalate (PET) substrate, a polycarbonate (PC) substrate, a polyethylene naphthalate (PEN) substrate, a polyetherimide (PEI) substrate, a polyacrylate (PAR) substrate or the like may be used.

The wettability changing part 12 includes a material in which critical surface tension (also called "surface free energy") is changed as a result of energy such as heat, ultraviolet rays, electron beam, plasma or the like being given thereto. Therefore, by giving energy by the above-mentioned means, high surface energy parts 12a and low surface energy parts 12b are formed. The high surface energy parts 12a include the depression parts having the same shapes as those of the electrically conductive parts 13, and have larger critical surface tension. The low surface energy parts 12b have smaller critical surface tension. It is noted that according to the embodiment of the present invention, the parts of the wettability changing layer to which energy is given become the high surface energy parts 12a as mentioned above. However, it is not necessary to limit an embodiment of the present invention thereto. Any other materials may be used as long as surface energy thereof is changed as a result of energy being given. For example, a material that is changed to a low surface energy part as a result of energy being given may also be used.

As the above-mentioned material in which critical surface tension is changed, such a material is preferable that critical surface tension thereof is changed by a large amount between before and after giving energy thereto. This is because such a material has a large contrast of lyophilic properties and liquid repellency between parts to which energy has been given and the others.

As such a material in which critical surface tension is changed, a high polymer material is preferable.

Further, it is preferable that the high polymer material is a high polymer material having hydrophobic groups in side chains.

As the hydrophobic groups of side chains, materials are not particularly limited, and functional groups having end groups that are —CF$_2$CH$_3$, —CF$_2$CF$_3$, —CF(CF$_3$)$_2$, —CFH$_2$ or the like may be cited. Further, alkyl groups or fluoroalkyl groups; alkyl groups or fluoroalkyl groups having multibranched structures; and isotopes thereof are preferable. These hydrophobic groups may be preferably attached to main chains via functional groups expressed by the structural formula —CO—, —COO—, —OCO—, —CONH—, —NHCOO— or —NHOCO—, and isotopes thereof, including C=O (carbonyl groups) and decomposed as a result of giving energy thereto. In this case, when the light sensitive groups such as the functional groups expressed by the structural formula —CO—, —COO—, —OCO—, —CONH—, —NHCOO— or —NHOCO— are cut off due to ultraviolet irradiation, the side chains react to moisture in the atmosphere, and hydrophilic groups such as carboxyl groups, hydroxyl groups or the like are generated. Therefore, the surface becomes hydrophilic (has high surface energy). In particular, in a case of side chains having multibranched structures, it is possible to remarkably change the critical surface tension of the wettability changing layer by giving a little energy thereto.

Further, also the main chains of the high polymer material are not particularly limited, but a material that does not absorb ultraviolet rays or absorbs ultraviolet rays a little is preferable. That is, a structure is preferable in which the molecular structures of the main chains are not cut by ultraviolet irradiation, or are less likely cut by ultraviolet irradiation. This is because, for example, when the main chains are cut as a result of giving energy thereto by ultraviolet irradiation, control itself of the high polymer material may be reduced so that the insulating properties may be reduced or so, and thus, the stability and/or the reliability of the material may be reduced.

As a specific structure of the main chain that satisfies these requirements, a skeleton obtained from polymerizing polyimide, polyamide-imide or (meth)acrylic acid (i.e., acrylic acid or methacrylic acid), or the like, may be cited for example. However, in consideration of the insulating properties, a structure of including polyimide in a main chain is especially preferable. Generally speaking, polyimide has a rigid structure, and also, repletion is high. Therefore, it is possible to maintain a certain level of insulating properties even when energy is given by ultraviolet irradiation or the like and molecular chains are cut, and thus, it is possible to form highly reliable interconnections. Further, in a case of using polyimide, the insulating properties are high and stable although hygroscopicity on the order of 2% exists. Therefore, it is possible that high insulating properties are ensured while wettability control is available.

As polyimide, thermosetting polyimide that is generated from dehydration and condensation reaction occurring as a result of heating polyamic acid (polyamide acid) and soluble polyimide that is soluble in a solvent are generally known. Either one may be used. When the soluble polyimide is used, it is possible to form a film by dissolving the soluble polyimide in a solvent, coating with a thus obtained coating liquid, and then, volatilizing the solvent at a low temperature less than 200° C. On the other hand, when the thermosetting polyimide is used, reaction does not occur unless heating the thermosetting polyimide to a temperature on the order of causing dehydration and condensation reaction. Therefore, in this case, generally speaking, it is necessary to heat it to a high temperature greater than or equal to 200° C. Therefore, either one may be selected depending on various conditions such as heat resistance of a substrate.

In particular, soluble polyimide may be preferably used such as that discussed in Japanese Laid-Open Patent Application No. 2009-188259 in a case where a low temperature process for a film substrate or the like is required, and surface energy is to be changed by a small ultraviolet irradiation amount for the purpose of improving the productivity. This soluble polyimide is polyimide including main chains and side chains that include multibranched structures, and may be preferably used as a material in which surface free energy is changed by ultraviolet irradiation.

The wettability changing layer 12 may be a single layer in which plural materials including the above-mentioned material in which the surface free energy is changed due to ultraviolet irradiation are mixed, or may be a single layer of the single material in which the surface free energy is changed due to ultraviolet irradiation. Further, it is also possible to use a mixture in which a first material and a second material are mixed. The first material has relatively superior electrical insulating properties. The second material is a material in which a ratio of changing the surface free energy due to giving energy such as ultraviolet rays is greater than the first material. In this case, using a difference in the physical properties of the two materials, a structure may be provided having a distribution of the materials along the film thickness direction.

Further, as will be described later as an embodiment 3 of the present invention, it is also possible to provide an insulating layer made of a material having high insulating properties below the wettability changing layer 12, i.e., between the substrate 11 and the wettability changing layer 12. In this case, it is possible to separate the respective functions between the wettability changing layer 12 and the insulating layer. As the material having high insulating properties, it is possible to cite, as an organic material, polyimide, polyamide-imide, epoxy resin, silsesquioxane, polyvinyl phenol, polycarbonate, fluorine-contained resin, polyparaxylylene, polyvinyl butyral, or the like. It is noted that polyvinyl phenol or polyvinyl alcohol may be used after crosslinking by using a suitable crosslinking agent. Further, as an inorganic material, TiO$_2$, SiO$_2$, or the like may be cited.

By using the wettability changing layer 12, the low surface energy areas 12b in which no electrically conductive parts such as interconnections are to be formed have repellency. Therefore, even in a case where electrically conductive ink droplets are coated with and run off from the depression parts that have the same shapes as those of the interconnection patterns, the electrically conductive ink droplets less likely adhere to the repellent areas and flow into the depression parts. Thus, no residue are generated. A thickness of the wettability changing layer 12 is not particularly limited, and is selected appropriately. This is because the required film thickness depends on the depth of the interconnections to be formed; the required insulating properties; the shapes of the wettability changing layer 12, for example, as to whether the wettability changing layer 12 is of a single layer or laminated layers; and so forth.

Next, a method of forming the depression parts (for example, 15 in FIGS. 2C and 2D) having the same shapes as those of the electrically conductive parts 13 will be described. The depression parts may be formed using any patterning method such as wet etching, a laser ablation method or the like.

However, from a viewpoint of reducing the number of processes, it is preferable to form the depression parts using a method, by which it is possible to change the surface free energy of the wettability changing layer at the same time of forming the depression parts, i.e., a laser ablation method using a laser of an ultraviolet region. By this method, it is possible to change the surfaces of the depression parts to high surface energy areas at the same time of forming the depression parts. Therefore, it is possible to obtain, in the single process, not only the physical shape effect of the depression parts but also the effect of minimizing the system free energy, and thus, the depression parts will be likely to be filled with an electrically conductive ink. Further, in a case of using a laser of an ultraviolet region, a reduction in the insulating properties of the wettability changing layer can be reduced. Further, it is possible to carry out the exposure in the atmosphere and thus high productivity can be obtained. Therefore, using a laser of an ultraviolet region is preferable.

Further, the widths of the electrically conductive parts are influenced by the widths of the depression parts to be formed, and also, variations in the resistance of the electrically conductive parts are influenced by variations in the working to form the depression parts. Therefore, a laser ablation method is preferred having smoothness and high working preciseness as much as possible. Further, in a case of using a laser of an ultraviolet region, it is possible to realize the working that is fine and has a few variations, and obtain neat worked surfaces. Further, by appropriately selecting a wavelength suitable for the wettability changing layer, it is possible to expect forming of the fine depression parts having high dimensional accuracy and the surface energy change. Also from these viewpoints, it is possible to preferably use a laser ablation method using a laser of an ultraviolet region.

As a laser of an ultraviolet region, a YAG laser of tripled frequency (wavelength: 355 nm), quadrupled frequency (wavelength: 266 nm), quintupled frequency (wavelength: 215 nm), an excimer laser of Xef (wavelength: 351 nm), XeCL (wavelength: 308 nm), KrF (wavelength: 248 nm) or ArF (wavelength: 193 nm) may be preferably used. Especially, in order to avoid influence to the processes and the environments due to the output and ozone generation in the atmosphere, it is preferable to use a YAG laser of tripled frequency (wavelength: 355 nm) or quadrupled frequency (wavelength: 266 nm), or an excimer laser. In particular, in a case where an excimer laser is used, any one of Xef (wavelength: 351 nm), XeCL (wavelength: 308 nm) and KrF (wavelength: 248 nm) is preferable.

As a specific method of forming the depression parts, for example, there may be a method of scanning with a laser beam using a fine laser required to form the depression parts and a method of moving the substrate (workpiece) itself that includes the wettability changing layer to be worked (so that the workpiece is relatively scanned with respect to a fixed laser beam). By using this method of scanning with a laser beam or moving the workpiece itself, no mask is needed, and therefore, the working can be realized at low costs. Further, it is possible to form a complicated pattern at a higher speed, while reducing an increase in the number of processes.

Especially, when the depression parts are formed by scanning with a laser beam, it is preferable to form the depression parts in the wettability changing layer by scanning with a laser beam using a galvano scanner.

Further, in a case where many repetitive patterns are to be formed, laser light may be irradiated in a step-and-repeat manner using a mask for a required interconnection pattern, to form the depression parts. In particular, in a case of using an excimer laser, the excimer laser has large output, which is advantageous for the method using a mask.

Next, the electrically conductive parts 13 will be described. The electrically conductive parts 13 are members that are obtained from firing a coated electrically conductive ink by heating using an oven, a hot plate, light or the like, and solidifying it through ultraviolet irradiation or the like. The electrically conductive ink is not particularly limited as long as it provides electrical conductivity after being solidified. For example, one obtained from dissolving an electrically conductive material in a solvent; one obtained from dispersing fine particles of an electrically conductive material in a solvent; a precursor of an electrically conductive material or one obtained from dissolving the precursor in a solvent; one obtained from dispersing a precursor of an electrically conductive material in a solvent; or the like, may be used. As specific examples of the electrically conductive material, there may be, for example, silver (Ag), gold (Au), copper (Cu), platinum (Pt), palladium (Pd), tungsten (W), nickel (Ni), tantalum (Ta), bismuth (Bi), lead (Pb), indium (In), tin (Sn), zinc (Zn), titanium (Ti) or aluminium (Al), an alloy made of two or more metals selected therefrom, silver halides or copper oxides of these metals may be cited. Further, one obtained from dispersing a nanocarbon material such as carbon nanotubes, graphene or the like in an organic solvent or water; an aqueous solution of electrically conductive high polymer such as doped polyaniline (PANI) or one obtained from doping polystyrene sulfonate (PSS) to polyethylene dioxythiophene (PEDOT); or the like, may be used. Especially, a low resistance material such as silver, copper, carbon nanotubes or the like is preferable. When using fine particles thereof, it is preferable to use ones obtained from coating the surfaces of the fine particles acting as the electrically conductive material with organic matter or electrically conductive material in order to prevent the material from scattering or being oxidized.

As specific examples of a method of coating the depression parts formed in the surface of the wettability changing layer with the electrically conductive ink, various printing methods may be cited, i.e., a spin coating method, a dip coating method, a screen printing method, an offset printing method, a flexographic printing method, a gravure printing method, a micro contact method, an inkjet method, a nozzle-printing method, an aerosol jet method and so forth. Especially, the inkjet method or the nozzle-printing method may be preferably used since it is possible to carry out coating with the viscosity and surface tension suitable for causing an electrically conductive ink to flow into depression parts, and provide small liquid droplets. Further, as to these two methods, the efficiencies of utilization of the materials are remarkably higher than the spin coating method and so forth, and these two methods are mask-less non-contact printing methods. Further, it is easy to apply to a case of forming a product that has a large area. From these points, these two methods are preferable.

Thus, when an electrically conductive pattern is formed, a wettability changing layer and a laser ablation method are used in a combining manner. As a result, it is possible to carry out, at the same time, forming of depression parts and changing the side walls of the depression parts into hydrophilic. Therefore, it is possible to form interconnection members that are finer, have a small reduction in the insulating properties, and high accuracy in the interconnection widths and interconnection thickness, with a small number of processes.

Further, although the example has been described above to have the single layer of the interconnection layer, it is possible to manufacture multilayered interconnections by repeating the process.

Further, not only the interconnection members mentioned above, but also, using the same procedure, an electronic device, and an electronic device array and a display device using the electronic devices can be manufactured, while taking advantage of the small number of processes thanks to applying printing. For an electronic device as an example thereof, a description will now be made. First, a wettability changing layer including a material in which critical surface tension is changed as a result of giving energy thereto is formed on a substrate. Next, using a laser ablation method using a laser of an ultraviolet region, depression parts having the same shapes as those of interconnection members and/or electrode parts included in the electronic device are formed in the wettability changing layer. Then, the depression parts are coated with an electrically conductive ink, and thus, electrically conductive parts that will be the interconnection members and/or electrode parts of the electronic device are formed. It is noted that at the same time of forming the patterns of the depression parts in the wettability changing layer, forming of the patterns of high surface energy areas is carried out by changing the critical surface tension. Further, as is necessary, various layers may be formed separately, and/or a laminated structure may be formed, and thus, the electronic device is obtained.

Thereby, it is possible to obtain the electronic device including the substrate, the wettability changing layer provided on the substrate and the electrically conductive parts formed in the wettability changing layer. The thus obtained electronic device has the electrically conductive parts that are fine and have little reduction in the insulating properties, the same as the above-mentioned case of the interconnection members.

Especially, in a case where the electronic device is a thin film transistor, an electrically conductive part(s) formed according to the embodiment of the present invention mentioned above may be used as at least one or more out of the gate, source and drain electrodes thereof. In this case, the bulk materials have almost no hygroscopicity and no failure occurs in the voltage withstanding properties between the laminated layers. Therefore, it is preferable to use the above-mentioned high polymer material, having polyimide in main chains, as the wettability changing layer.

Further, it is possible to manufacture an electronic device array by disposing plural of the above-mentioned electronic devices on the substrate. Then, by using the electronic device array, it is possible to form a display device.

Below, specific embodiments of the present invention will be described in detail. However, the present invention is not limited to these embodiments.

Embodiment 1

FIGS. 2A, 2B, 2C, 2D and 2E illustrate a method of manufacturing interconnection members according to an embodiment 1 of the present invention. As shown in FIG. 2A, a wettability changing layer 12 was formed on a glass substrate 11 for which wet cleaning had been carried out.

As a raw material of the wettability changing layer 12, a polyimide NMP solution was used in which a soluble polyimide material A (expressed by the following structural formula (1)) including dendrimers in side chains and polyimide CT4112 (trade name, made by KYOCERA Chemical Corporation) having the insulating properties higher than the polyimide material A and having no side chains are mixed.

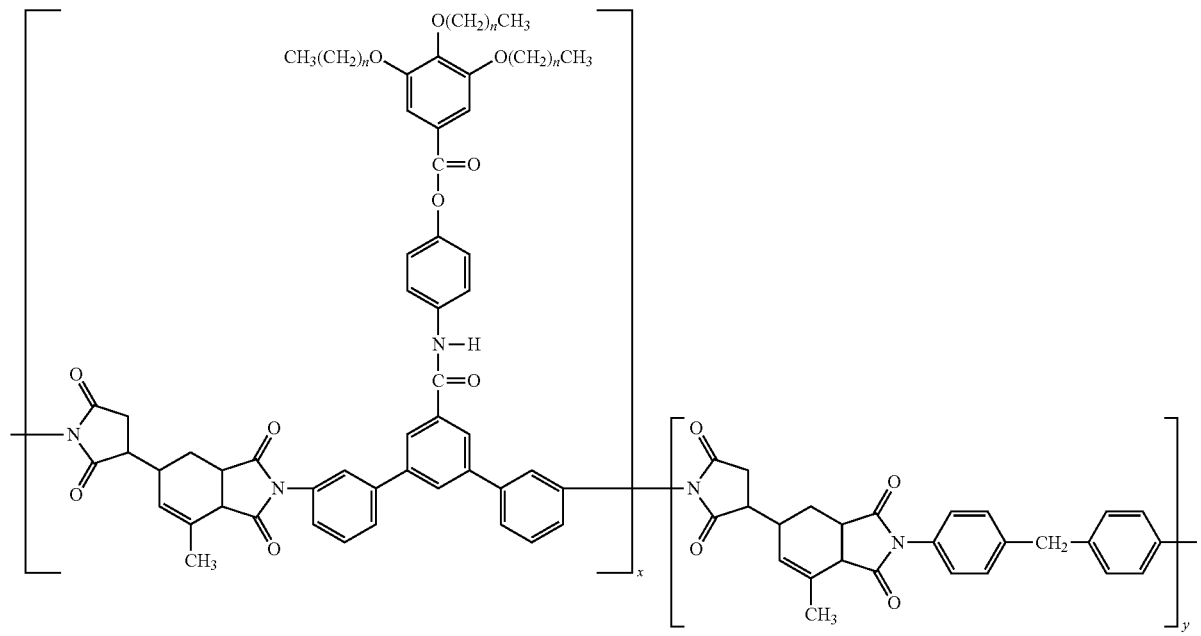

(1)

Then, the glass substrate 11 was coated with the above-mentioned polyimide NMP solution by a spin coating method. Next, in a nitrogen atmosphere, pre-baking was carried out in an oven of 100° C. Further, in a nitrogen atmosphere, in an oven of 180° C., post-baking was carried out for 1 hour. Thus, the wettability changing layer 12 having a film thickness of 700 nm was formed (FIG. 2A). At this time, the surface of the wettability changing layer 12 had low surface energy from the polyimide having the hydrophobic side chains.

Figure 3:
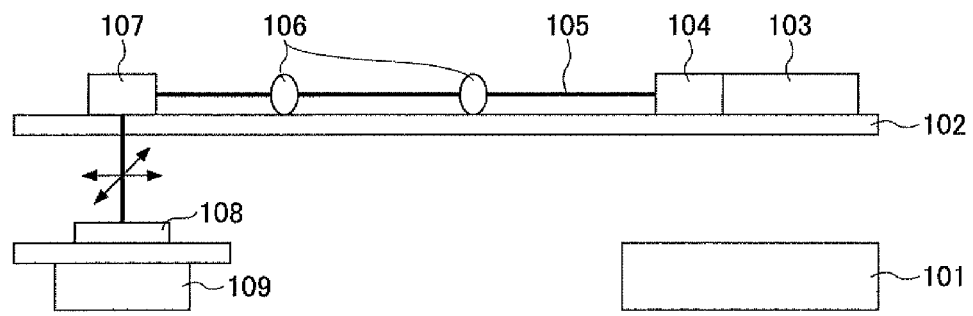
FIG. 3 illustrates a laser ablation apparatus according to an embodiment of the present invention.

Next, based on CAD data, depression parts 15 having the same shapes as those of electrically conductive parts were formed (FIGS. 2B and 2C) by irradiating laser light 14 of an ultraviolet region using a laser ablation apparatus shown in FIG. 3, at parts corresponding to the electrically conductive parts such as interconnections, electrodes and/or the like. The surfaces of the depression parts 15 at which the laser light had thus been irradiated became high surface energy areas 12a, and the areas at which no laser light had been irradiated were low surface energy areas 12b due to the hydrophobic side chains of the polyimide.

The laser ablation apparatus thus used will now be described using FIG. 3. In the embodiment 1, as a laser 103, a YAG laser was used. The laser 103 that oscillates uses a laser head 104 to generate quadrupled frequency waves having a wavelength of 266 nm. Then, a laser beam 105 is controlled by an optical system 106 and Z movements (Z scanning) of a XYZθ stage 109 so that the laser beam 105 may have an appropriate beam diameter and an appropriate beam shape such as a top hat shape or a Gaussian shape on the working surface of a workpiece 108.

Then, by the control of a galvano scanner 107, the XYZθ stage 109 and the laser 103 with a controller 101, the depression parts were formed according to a CAD drawing. In a case of thus using such an optical system in which the XYZθ stage 109 and the galvano scanner 107 are combined, it is possible to form the depression parts in the wettability changing layer by carrying out scanning with a laser beam using the galvano scanner 107 on certain drawing areas. Therefore, it is possible to carry out the drawing with lesser energy than moving the stage. Further, since it is possible to draw not only straight lines in XY directions or oblique directions but also patterns of circles, ellipses and/or rectangles, and thus it is possible to draw more complicated shapes, the degree of freedom of design is increased.

However, the drawing area of the galvano scanner 107 is limited. It is possible to carry out the drawing for a larger area by combining with XY movements of the XYZθ stage 109 for moving (scanning with) the workpiece 108 with respect to the laser beam. Further, for a case of forming multilayered interconnections or an electronic device such as a thin film transistor, superposition of upper and/or lower functional layer(s) is needed, and therefor, the XYZθ stage 109 is moved (scanned with) in θ directions and XY directions, and thus, it is possible to obtain satisfactory superposition (or lamination).

It is noted that the above-mentioned parts 103, 104, 106 and 107 are provided on a base member 102.

Figure 4:
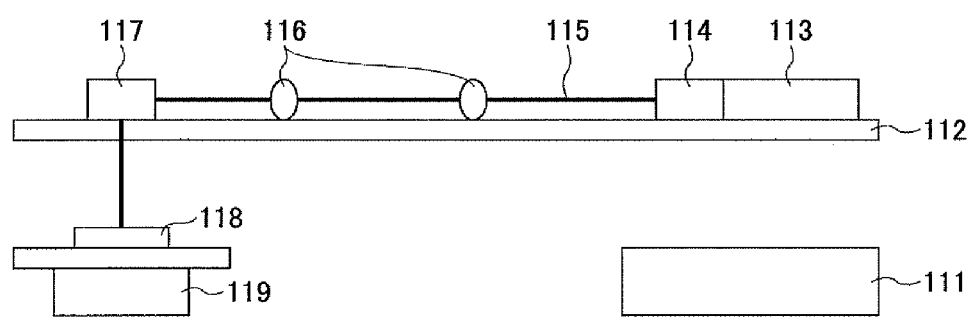
FIG. 4 illustrates a laser ablation apparatus according to another embodiment of the present invention.

Further, the laser ablation apparatus is not limited to the above-mentioned one using the galvano scanner 107. For example, as shown in FIG. 4, it is also possible to combine a XYZθ stage 119 and a reflecting optical system 117. The laser ablation apparatus of FIG. 4 is effective for a case where interconnections have simple patterns such as patterns in XY directions and partially in oblique directions. Further, it is possible to carry out the drawing for a large area by increasing the size of the XYZθ stage 119. In the laser ablation apparatus of FIG. 4, the same as that of FIG. 3 described above, a laser beam 115 is provided by a laser 113 and a laser head 114 and is controlled by an optical system 116 and Z movements of a XYZθ stage 119. The reflecting optical system 117, the XYZθ stage 119 and the laser 113 are controlled by a controller 111, and the drawing is carried out onto a workpiece 118 by the laser beam via the reflecting optical system 117. Except for the using of the reflecting optical system 117 instead of the galvano scanner 107, the laser ablation apparatus of FIG. 4 operates in the same way as the laser ablation apparatus of FIG. 3 described above, and duplicate description will be omitted.

It is noted that the above-mentioned parts 113, 114, 116 and 117 are provided on a base member 112.

Using the above-mentioned laser ablation apparatus, the depression parts having widths of 50, 40, 30, 20, 15, 10 μm and a depth of 150 nm were formed in the embodiment 1. These widths and depth can be controlled by controlling the laser output, the scanning (moving) speed, the oscillation frequency, the beam diameter, the focal position and so forth. Here, the scanning (moving) speed was 200 mm/s.

A result of studying the relationship between the energy density per one pulse laser light irradiated to the wettability changing layer and the average difference in level (depth) of the depression parts will be described using FIG. 5.

For carrying out the study, as a wettability changing layer, a polyimide layer formed on a glass substrate was used. For forming the wettability changing layer, a polyimide NMP solution was used in which a soluble polyimide material A including dendrimers in side chains and polyimide CT4112 (trade name, made by KYOCERA Chemical Corporation) having the insulating properties higher than the polyimide material A and having no side chain were mixed. After the glass substrate was coated with the polyimide NMP solution, pre-baking at 100° C. in a nitrogen atmosphere was carried out, and further, post-baking was carried out for 1 hour at 180° C. in a nitrogen atmosphere. At this time, the film thickness of the polyimide layer was 500 nm. Further, the scanning (moving) speed with a laser beam was 240 mm/second, and thus, depression parts were formed.

Figure 5:
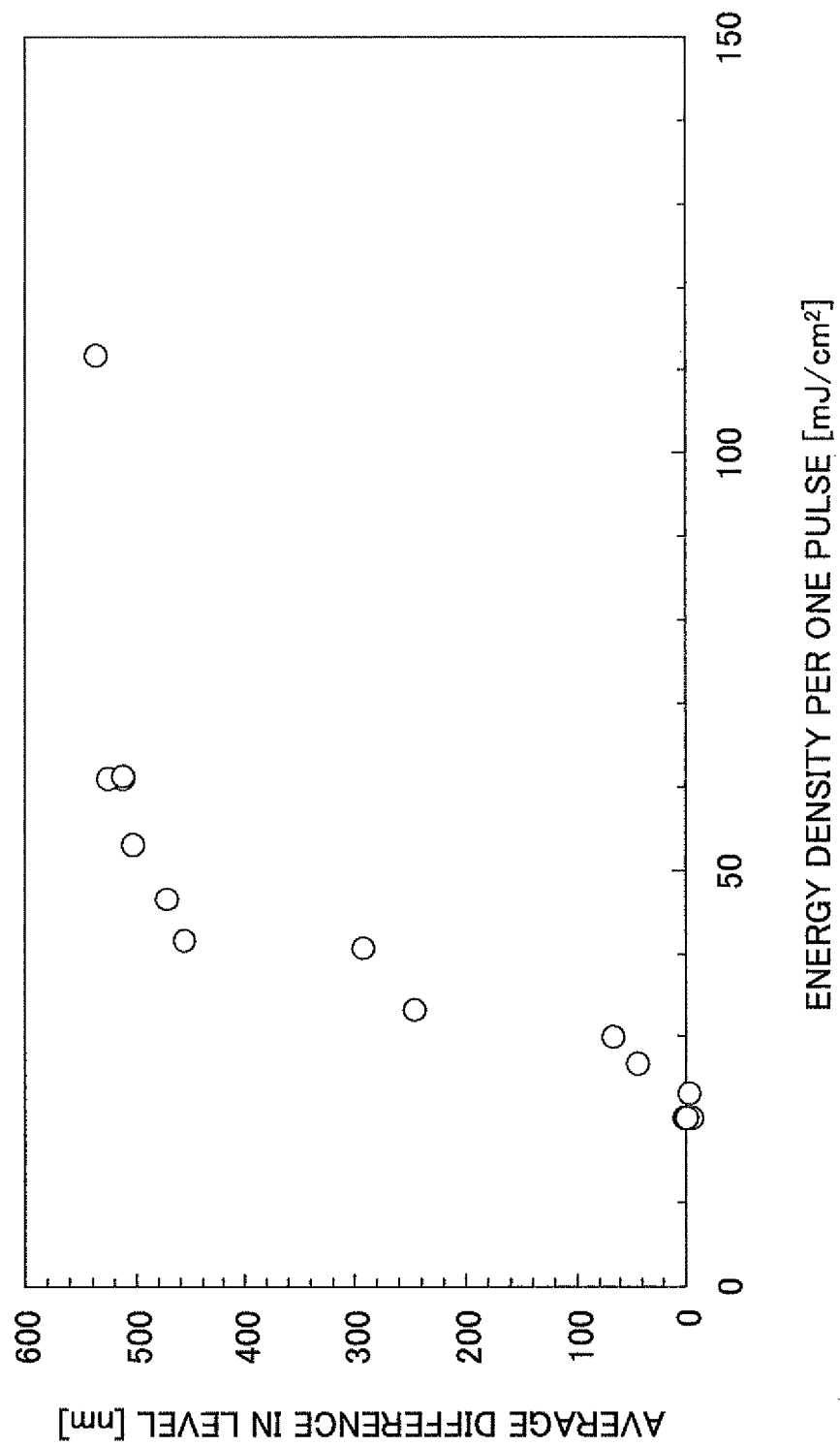
FIG. 5 illustrates one example of a relationship between a worked depth of a wettability changing layer and laser characteristics according to a laser ablation method of an embodiment of the present invention.

FIG. 5 illustrates one example of a relationship between the working depth in the wettability changing layer and the laser characteristics according to the laser ablation method. The abscissa axis of FIG. 5 indicates the light energy density (mJ/cm$^2$) per one pulse and the ordinate axis indicates the average difference in level (depth) (nm) of the depression parts.

The "average difference in level" means the average value of the differences in level (depth) obtained when laser light of a certain energy density was irradiated onto the wettability changing layer linearly over 5000 μm, the depression parts were thus formed, and measurements were made for 5 points.

As can be seen from FIG. 5, as the energy density per one pulse is increased, the average difference in level (worked depth) of the depression parts formed in the polyimide layer becomes deeper. That is, by controlling the energy density per one pulse, it is possible to adjust the depth of the depression part, and thus, it is possible to remove the entirety of the polyimide film thickness of 500 nm or remove a part of the polyimide film thickness of 500 nm.

Patent reference No. 5, mentioned above, discloses that by ultraviolet irradiation, a depression part can be formed by a reduction in film thickness of 10% or less of the film thickness, of a wettability controlling film. However, in this case, the depression part depth is 10% of the wettability controlling film thickness at the maximum. Therefore, in a case where the film thickness is 500 nm, the depression part depth is limited to 50 nm. In contrast thereto, according to the embodiment 1 of the present invention, as shown in FIG. 5, it is possible to form a deeper depression part to correspond to a design of an electrically conductive layer.

Next, using FIG. 6, one example of a worked shape of a wettability changing layer according to a laser ablation method will be described.

Figure 6:
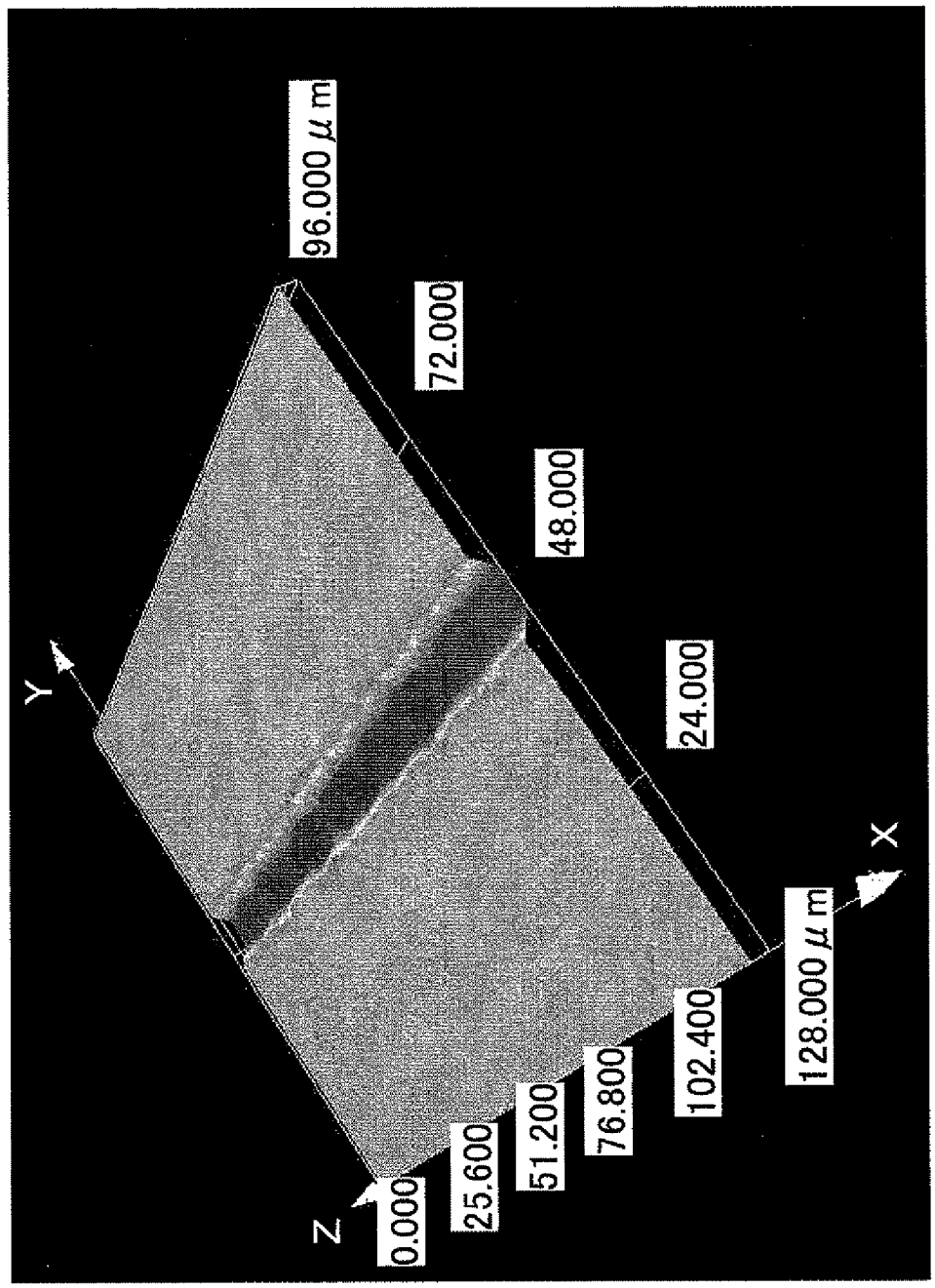
FIG. 6 illustrates one example of a worked shape of a wettability changing layer according to a laser ablation method of an embodiment of the present invention.

FIG. 6 shows a result of observation and measurement of a shape of a depression part using a microscope after the depression part was formed in a wettability changing layer by a laser ablation method.

In FIG. 6, as the wettability changing layer, a polyimide layer formed on a glass substrate was used. The polyimide layer was formed in the same or similar procedure as that of the above-mentioned case of studying the relationship between the energy density per one pulse laser light and the average difference in level described above using FIG. 5, and the film thickness of the polyimide layer was 500 nm. Further, the laser light scanning (moving) speed when the depression part was formed was 200 mm/s, and the entirety of the polyimide layer was removed at the part at which the depression part was formed.

In FIG. 6, the z-axis is indicated on a scale of 5 times greater than that of the x-axis and y-axis, and the depression part had the line width of 10 μm and the depth of 500 nm. The depression part had tapering shapes at both ends and each has a size of approximately 2 μm in a horizontal direction and 500 nm in height. That is, as can be seen, the depression part has the tapering shape such that the opening part has a width wider than the bottom part. Also the side walls that form the tapering shapes (the depression part) were modified to have high surface energy by laser ablation, and further, had shapes such that an electrically conductive ink is likely to flow into the depression part even in a case where the variations in inkjet landing position and the diameters of liquid droplets were large and both the depression part and the outside lower energy areas were coated with the electrically conductive ink.

Returning to FIGS. 2A through 2E, next, the depression parts 15 were selectively coated with an electrically conductive ink (nano metal ink) 16 in which Ag particles having a particle size of approximately 30 nm were dispersed in a water-based solvent, in an inkjet method (FIG. 2D). Since the water-based metal fine particle dispersed liquid was thus used, the electrically conductive ink ran over the depression parts 15 formed by laser ablation. Therefore, it is possible to form even a fine pattern without regard to the inkjet liquid droplet size. Next, pre-baking was carried out in the atmosphere using an oven of 100° C., and post-baking was carried out for 1 hour also in the atmosphere using an oven of 180° C. Thereby, electrically conductive parts 13 were formed (FIG. 2E) having the same line widths as those of the respective depression parts and having a film thickness of 130 nm. This film thickness of the electrically conductive parts 13 was a film thickness greater than or equal to a film thickness obtained when the electrically conductive ink that can be held in the depression parts would have been fired and solidified. It can be presumed that this was because, during the electrically conductive ink drying process after the inkjet printing, the electrically conductive ink existing on the low surface energy areas 12b was dried while flowing into the depression parts 12a formed by laser ablation along with it being dried as the solvent was volatilized.

Figure 7:
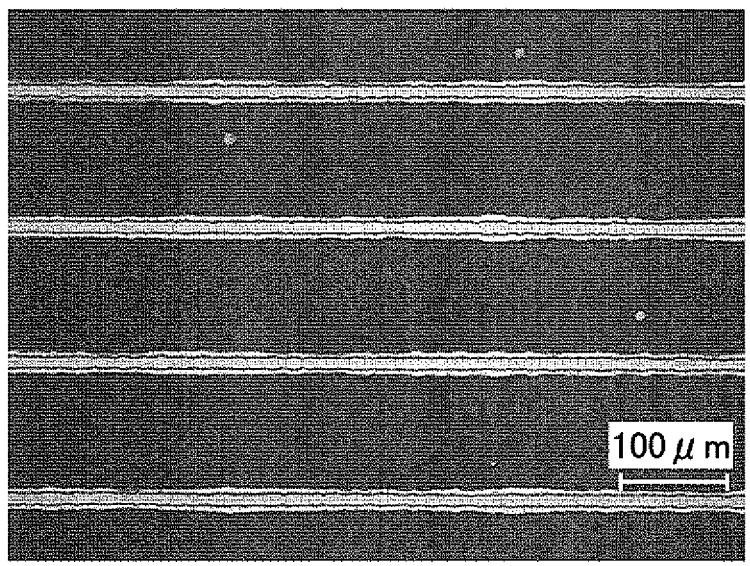
FIG. 7 is a plan view (observed by a microscope) of interconnections obtained by the embodiment 1 of the present invention.

In this point, the embodiment of the present invention seems different from the method in the related art using the above-mentioned bank and different from depression parts formed only using laser ablation. FIG. 7 shows an observation result viewed from the top of the electrically conductive parts having a line width of 10 μm that is minimum. Therefrom, it can be confirmed that in any cases, the electrically conductive ink was inside the depression parts, and did not exist on the surface of the wettability changing layer.

Further, the formed states of the respective electrically conductive parts with respect to line widths are shown in Table 1 below. The sign "○" is given for those formed without any defects.

TABLE 1

| LINE WIDTH (μm) | | | | | |
|---|---|---|---|---|---|
| 50 | 40 | 30 | 20 | 15 | 10 |
| ○ | ○ | ○ | ○ | ○ | ○ |

Therefrom, it can be seen that, according to the embodiment 1 of the present invention, the electrically conductive parts could have been formed from the line width of 50 μm through the minimum dimension of 10 μm. These include ones remarkably finer than the ordinary inkjet resolution of 50 μm. Further, the finer electrically conductive parts (interconnections) could be stably formed than the comparison example 1 described below in which only a wettability changing layer was used but a laser ablation method was not used.

Thus, according to the embodiment 1 of the present invention, the wettability changing layer 12 and the electrically conductive parts 13 can be formed by a printing method such as an inkjet method. Therefore, despite the low costs, the finer electrically conductive parts (interconnections) can be formed. Further, by removing a wettability changing layer in a laser ablation method using a laser of an ultraviolet region and coating with an electrically conductive ink by an inkjet method, it is possible to form finer electrically conductive parts (interconnections), while taking advantage of the smaller number of processes thanks to applying printing. Further, by carrying out scanning with (moving) a laser beam using a galvano scanner in a laser ablation method, no mask is needed, and thus, it is also possible to deal with complicated patterns at higher speed with low costs.

Comparison Example 1

As a comparison example, an example will be described in which a laser ablation method was not used, and only ultraviolet rays were irradiated to a wettability changing layer. A procedure is shown in FIGS. 8A, 8B, 8C and 8D.

Figure 8A:
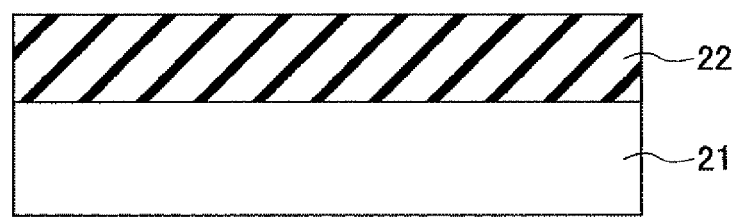
FIGS. 8A, 8B, 8C and 8D illustrate a method of manufacturing an interconnection member according to a comparison example 1.

First, in the same procedure as that of the embodiment 1 described above, a wettability changing layer 22 was formed using a polyimide NMP solution as a raw material on a glass substrate 21 on which wet cleaning had been carried out (FIG. 8A).

Figure 8B:
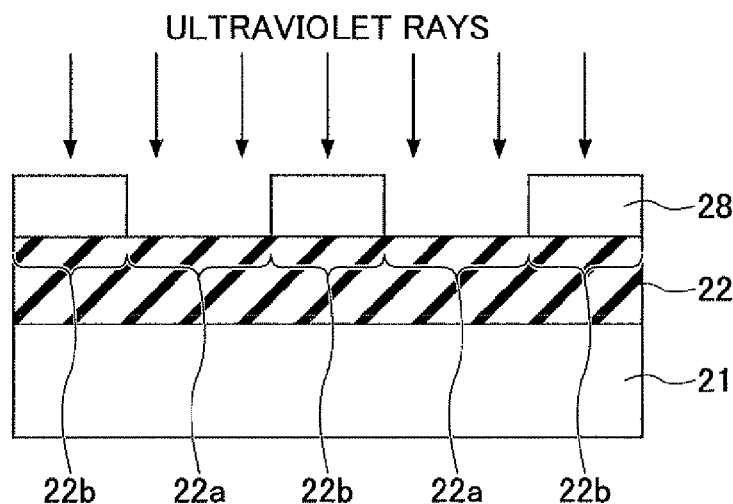

Next, ultraviolet rays of a wavelength less than or equal to 300 nm were irradiated (by a super-high pressure mercury lamp) to the wettability changing layer 22 through a photo mask 28 having openings at parts corresponding to electrically conductive patterns (FIG. 8B). At this time, no depression parts were formed in the wettability changing layer 22, and high surface energy parts (ultraviolet rays being irradiated) 22a and low surface energy parts (ultraviolet rays not being irradiated) 22b were formed on an approximately flat plane. It is noted that at this time, the ultraviolet irradiation amount was 2 J/cm².

Figure 8C:
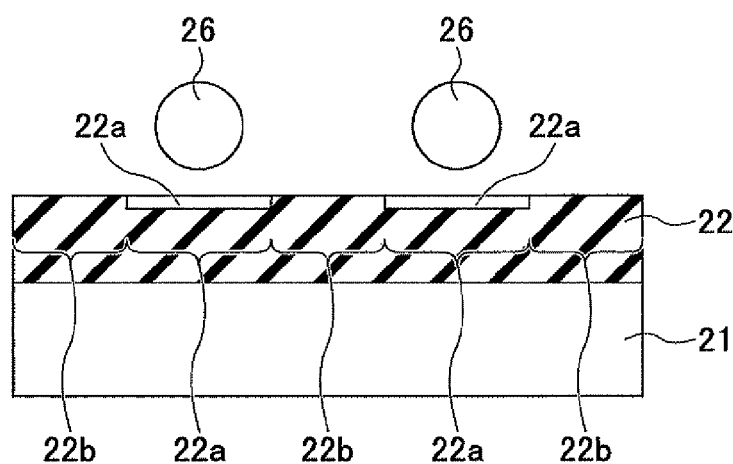

Further, the same as or similar to the embodiment 1, the high surface energy parts were selectively coated with a metal fine particle dispersed liquid (electrically conductive ink) 26 in which Ag particles were dispersed in a water-based solvent, by an inkjet method (FIG. 8C). After that, in conditions the same as or similar to those of the embodiment 1, pre-baking and post-baking were carried out.

Figure 8D:
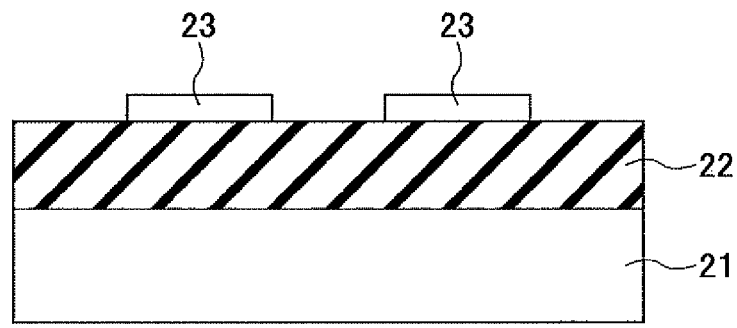

In the above-mentioned method, electrically conductive parts 23 of widths 50, 40, 30, 20, 15 and 10 μm, and a film thickness 130 nm were formed (FIG. 8D). The formed states of the thus-obtained respective interconnections are shown in Table 2 below. In Table 2, a sign "○" is given to the cases where the respective interconnections could be formed. A sign "Δ" is given to the cases where parts of the respective interconnections could not be formed. A sign "X" is given to the cases where there occurred shortages between adjacent interconnections or disconnections. It can be seen that in the comparison example 1, although the interconnections (electrically conductive parts) finer than the ordinary inkjet resolution 50 μm could be formed, defects appeared for the line widths of 15 and 10 μm.

TABLE 2

| LINE WIDTH (μm) | | | | | |
|---|---|---|---|---|---|
| 50 | 40 | 30 | 20 | 15 | 10 |
| ○ | ○ | ○ | ○ | Δ | X |

Comparison Example 2

As a comparison example 2, an example will be described in which a soluble polyimide material A including dendrimers in side chains was not mixed, a film was formed only using polyimide CT4112 (trade name, made by KYOCERA Chemical Corporation) that has no side chains, no wettability changing layer was formed, and only an insulating layer was formed.

First, an insulating layer having a film thickness of 500 nm was formed on a glass substrate on which wet cleaning had been carried out, in the same procedure as the embodiment 1 except that a polyimide NMP solution was used in which a soluble polyimide solution A including dendrimers in side chains was not mixed and only polyimide CT4112 (trade name, made by KYOCERA Chemical Corporation) having no side chains was included. Specifically, the glass substrate was coated with the above-mentioned polyimide NMP solution by a spin coating method, then pre-baking was carried out in an oven of 100° C. in nitrogen atmosphere, and post-baking for 1 hour was carried out in an oven of 180° C. in nitrogen atmosphere. Since there was no polyimide having hydrophobic side chains, the insulating layer surface had higher surface energy than the wettability changing layer surface.

Next, based on CAD data, depression parts having the same shapes as electrically conductive parts were formed by irradiating laser light of an ultraviolet region using a laser ablation apparatus at parts corresponding to the electrically conductive parts such as interconnections and/or electrodes. The laser used was a YAG laser, and a laser head was used to generate quadrupled frequency waves having a wavelength of 266 nm. In the comparison example 2, depression parts of widths: 50, 40, 30, 20, 15 and 10 μm, and a depth: 500 nm were formed. These widths and depth can be controlled by controlling the laser output, the scanning (moving) speed, the oscillation frequency, the beam diameter, the focal position and so forth.

Next, using an inkjet method, the depression parts were selectively coated with an electrically conductive ink (nano metal ink) in which Ag particles having a particle size of approximately 30 nm were dispersed in a water-based solvent. Next, in a way the same as or similar to the embodiment 1, pre-baking was carried out with an oven of 100° C. in the atmosphere, and post-baking was carried out for 1 hour with an oven of 180° C. also in the atmosphere.

Although the depression parts are deeper than the embodiment 1, defects partially occurred even for the line width: 50 μm, and interconnections could not be formed for all the line widths less than or equal to 40 μm.

Figure 9:
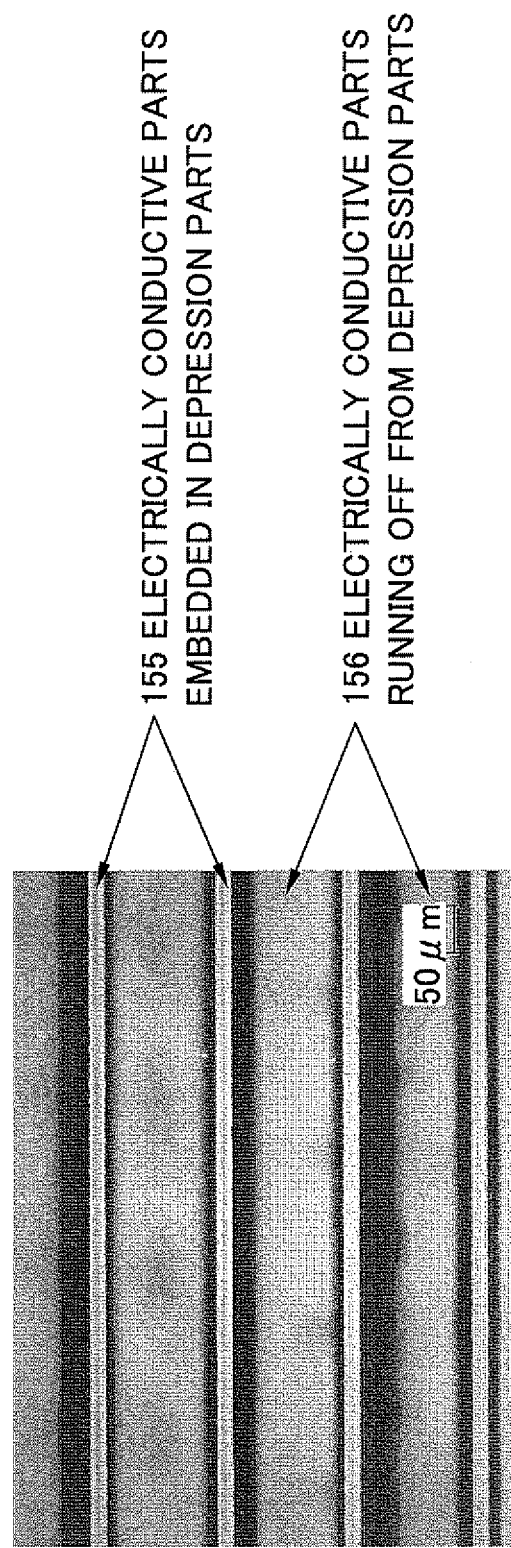
FIG. 9 is a plan view (observed by a microscope) of interconnections obtained by a comparison example 2.

FIG. 9 shows an observation result (microscope observation plan view) viewed from the top of the electrically conductive parts having the line width: 15 μm. According to FIG. 9, the electrically conductive ink ran over not only the electrically conductive parts 155 embedded in the depression parts but also the outside thereof 156, and were dried. The electrically conductive ink running over the outside of the depression parts became "electrically conductive parts 156 running off from the depression parts". Therefore, it is not possible to form fine interconnections, and leakage may occur between interconnections.

It can be considered that the electrically conductive ink adhered to not only the depression parts but also the outside thereof because in comparison to the diameters of the ink droplets of the inkjet (in this case, for example, diameter: 25 μm), the interconnection width was as small as 15 μm, and also, inkjet landing positions might vary and the ink might run after the landing.

Further, in the comparison example 2, the following matter is presumed. Since the soluble polyimide material A including dendrimers in side chains was not mixed in the polyimide NMP solution used as the raw material of the insulating layer, no wettability changing layer was formed, thus the simple insulating layer was formed, and therefore, the surface thereof did not have low surface energy. Therefore, the electrically conductive ink having landed on the areas other than the depression parts was dried, as it was, without having been able to flow into the depression parts.

From the above-mentioned result, it can be seen that in the comparison example 2, when no wettability changing layer is formed and only depression parts are formed using laser ablation, fine interconnections may not be formed.

Embodiment 2

An embodiment 2 of the present invention is an example in which, the depth of depression parts and the thickness of electrically conductive parts were controlled by controlling the film thickness of a wettability changing layer.

Figure 10:
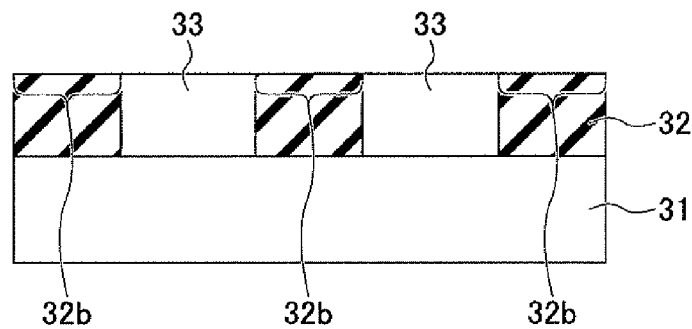
FIG. 10 is a sectional view of an interconnection member according to an embodiment 2 of the present invention.

FIG. 10 schematically shows interconnection members obtained by the embodiment 2. Below, the procedure will be described using FIG. 10.

According to the embodiment 2, a wettability changing layer 32 having a film thickness of 500 nm was formed using the polyimide NMP solution as the raw material, by the same procedure as that of the embodiment 1 described above, on a film substrate 31 for which wet cleaning has been carried out. At this time, by the polyimide having the side chains having hydrophobicity, the surface of the wettability changing layer was made to have low surface energy.

Figure 11:
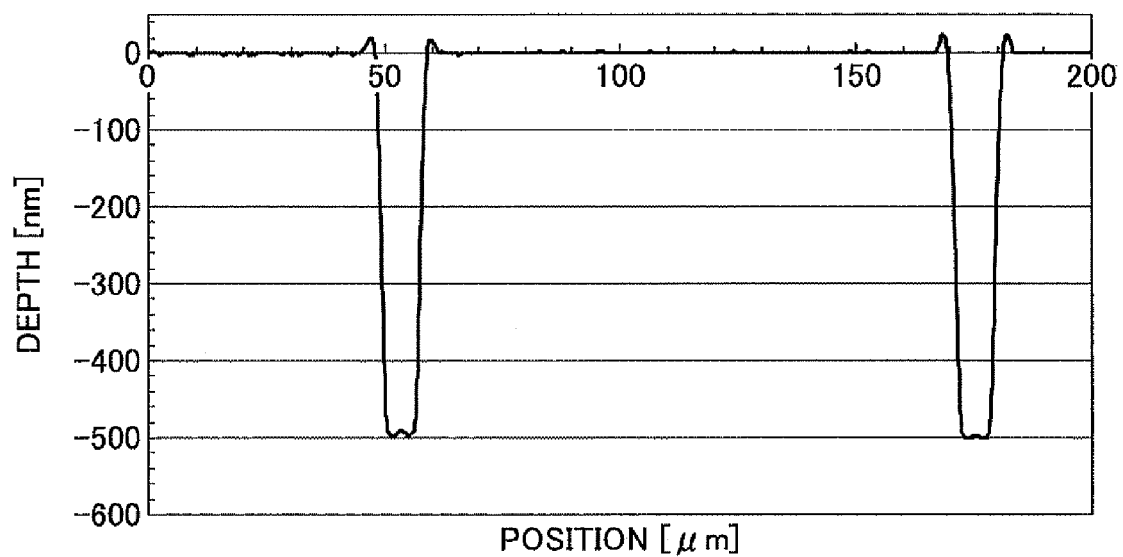
FIG. 11 is a section profile of a depression part formed according to the embodiment 2 of the present invention.

Next, using laser light of quadrupled frequency (wavelength: 266 nm) of a YAG layer, in a way the same as or similar to the embodiment 1, depression parts having the same shapes as interconnections were formed with a laser ablation apparatus. At this time, a laser ablation method was carried out while the laser output was made higher than the embodiment 1. However, only the wettability changing layer 32 was removed without causing any damage to the shape of the substrate surface 31. FIG. 11 shows a result of measuring sectional shapes of the depression parts at this time using a stylus profilometer. It can be seen that the depth of the depression parts was 500 nm approximately equal to the thickness of the wettability changing layer 32.

Then, using a nozzle-printing method, the depression parts were coated with an electrically conductive ink (nano metal ink), the same as or similar to that of the embodiment 1, in which Ag particles were dispersed in a water-based solvent. Also in a case of a nozzle-printing method, the same as in an inkjet method, it is possible to give an electrically conductive ink selectively to a target part. Therefore, in comparison to a case of using spin coating and etching to form electrically conductive parts, the efficiency of utilization of the materials are high, and also, operation can be carried out at very high speed. Therefore, this method is advantageous in forming interconnections at low cost with high productivity.

Further, in conditions the same as or similar to those of the embodiment 1, pre-baking and post-baking were carried out, respectively, and electrically conductive parts 33 having interconnection width of 10 μm and film thickness of 500 nm were formed.

In the related art, it is possible to manufacture interconnections having the interconnection width on the order of 100 μm at the minimum in a nozzle-printing method. In contrast thereto, it has been confirmed that interconnections also having the interconnection width of 10 μm can be formed according to the embodiment 2. In other words, according to the method of the embodiment 2, it is possible to form interconnections that are remarkably fine in comparison to the related art.

Further, according to the embodiment 2, the wettability changing layer 32 was almost completely removed at parts when the depression parts were formed at the corresponding parts so that the bottoms of the electrically conductive parts would become the substrate 31. In this method, the depth of the depression parts is determined by the film thickness of the wettability changing layer 32. Therefore, it is possible to make the thicknesses of the electrically conductive parts 33 more uniform. Therefore, it is possible to provide interconnections having smaller variations in the interconnection resistance.

It is noted that the reference numerals 32b in FIG. 10 denotes low surface energy parts/areas.

Embodiment 3

Figure 12A:
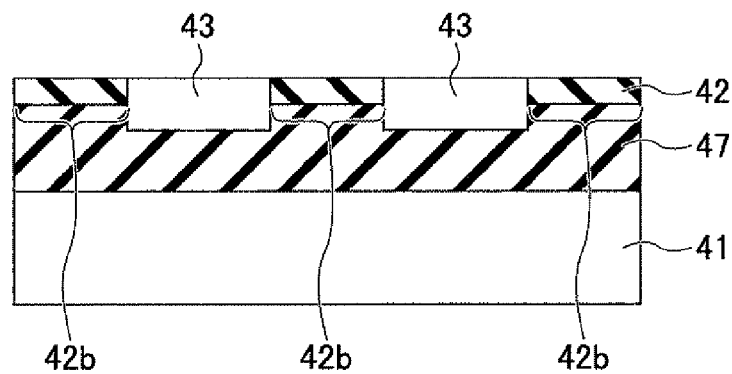
FIG. 12A is a sectional view of an interconnection member according to an embodiment 3 of the present invention.

An embodiment 3 of the present invention is an example in which, as shown in FIG. 12A, an insulating layer 47 was provided in addition to a wettability changing layer 42 on a substrate 41.

In this case, as shown in FIG. 12A, the insulating layer 47 was provided between the substrate 41 and the wettability changing layer 42.

First, after a film substrate 41 on which wet cleaning had been carried out was coated with a polyimide solution PI213B (trade name, made by Maruzen Petrochemical Co., Ltd.) using a spin coating method, pre-baking at 100° C. and firing at 180° C. were then carried out in nitrogen atmosphere, and the insulating film 47 having a thickness of 500 nm was formed.

Next, after the insulating layer 47 was coated with a thermosetting polyimide NMP solution having hydrophobic groups in side chains as a raw material using a spin coating method, pre-baking at 100° C. and firing at 180° C. were carried out in a nitrogen atmosphere, and a wettability changing layer 42 made of polyimide having thickness of 100 nm was formed.

Then, at parts corresponding to interconnection patterns, depression parts were formed having the same shapes as the interconnections in both the wettability changing layer 42 and the insulating layer 47 at the same time as shown in FIG. 12A using a laser ablation method using an excimer laser of KrF (wavelength: 248 nm). Each depression part had a width of 20 μm and a depth of 250 nm. Areas at which the laser light had not been irradiated were low surface energy areas 42b due to the hydrophobic side chains of the polyimide.

Further, using an inkjet method, the depression parts were coated with an electrically conductive ink (nano metal ink), the same as or similar to that of the embodiment 1, in which Ag particles had been dispersed in a water-based solvent. Next, pre-baking and post-baking in conditions the same as or similar to those of the embodiment 1 were carried out. Thereby, electrically conductive parts 43 each having an interconnection width of 20 μm and a film thickness of 250 nm were formed.

In contrast to a resolution on the order of 50 μm obtained using a common inkjet method, it was possible to form the electrically conducive parts 43 that were remarkably fine in the embodiment 3. Further, in the embodiment 3, since the insulating layer was formed as a lower layer, it was possible to form interconnections that were more reliable.

Figure 12B:
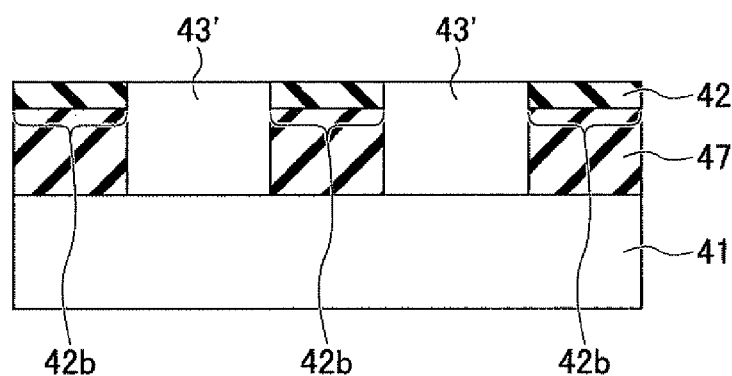
FIG. 12B is a sectional view of an interconnection member according to a variant embodiment of the embodiment 3 of the present invention.

It is noted that also in the embodiment 3, the same as the embodiment 2, it is possible to provide depression parts down to the top surface of the substrate. FIG. 12B shows a variant embodiment of the embodiment 3 corresponding thereto. In this case, as shown in FIG. 12B, the depth of the depression parts 43' becomes equal to the thickness from the top surface of the wettability changing layer 42 to the top surface of the substrate 41, i.e., the thickness of the sum total of the wettability changing layer 42 and the insulating layer 47 below the wettability changing layer 42. Thus, the same as the case of the embodiment 2, it is possible to control the thickness of the electrically conductive parts more precisely.

Embodiment 4

Figure 13:
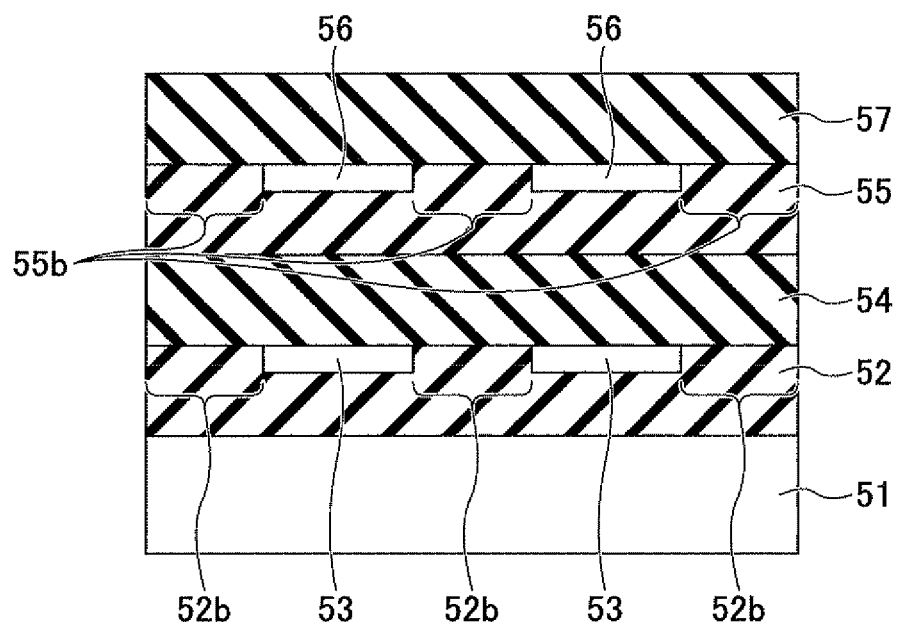
FIG. 13 is a sectional view of multilayered interconnections according to an embodiment 4 of the present invention.

As an embodiment 4 of the present invention, a method of forming multilayered interconnections will be described. FIG. 13 schematically shows multilayered interconnections obtained from the method.

First, after a glass substrate 51 on which wet cleaning had been carried out was coated in a spin coating method with the thermosetting polyimide NMP solution having the hydrophobic groups in side chains used in the embodiment 3 as a raw material, pre-baking at 100° C. and firing at 180° C. were carried out in a nitrogen atmosphere, and a first wettability changing layer 52 was formed having a film thickness of 150 nm. At this time, the surface of the first wettability changing layer 52 had low surface energy due to the polyimide having the hydrophobic side chains.

Next, in a laser ablation method using laser light of quadrupled frequency (wavelength: 266 nm) of a YAG laser, at parts corresponding to first electrically conducive parts, depression parts each having a width of 20 μm and a depth of 100 nm were formed in the first wettability changing layer 52. The areas on which the laser light had not been irradiated were low surface energy areas 52b due to the hydrophobic side chains of the polyimide.

Then, using an inkjet method, the depression parts were coated with an electrically conductive solution (nano metal ink), the same as or similar to that of the embodiment 1, in which Ag particles had been dispersed in a water-based solvent. After that, in conditions the same as or similar to those of the embodiment 1, pre-baking and post-baking were carried out. Thereby, the first electrically conductive parts 53 each having an interconnection width of 20 μm and a film thickness of 100 nm were formed.

On the first wettability changing layer 52 including the thus obtained first electrically conducive parts 53, further interconnection members were formed. First, in order to keep the insulating properties of the first electrically conductive parts, an upper layer thereof was coated with epoxy resin by spin coating, and an insulating layer 54 was formed.

Next, as an upper layer of the insulating layer 54, a second wettability changing layer 55 having a film thickness of 150 nm was formed using a polyimide NMP solution as a raw material in a way the same as or similar to that of the first wettability changing layer.

Then, in conditions and procedure the same as or similar to those of the case of the first wettability changing layer 52, depression parts each having a width of 20 μm and a depth of 100 nm were formed in the second wettability changing layer 55 by a laser ablation method. Also in this case, the areas on which the laser light had not been irradiated were low surface energy areas 55b due to the hydrophobic side chains of the polyimide.

Further, by an inkjet method, in the same or similar way, the depression parts were coated with an electrically conductive solution (nano metal ink) in which Ag particles had been dispersed in a water-based solvent. After that, in conditions the same as or similar to those of the first electrically conductive parts, pre-baking and post-baking were carried out. Thereby, second electrically conductive parts 56 each having an interconnection width of 20 μm and a film thickness of 100 nm were formed. Further, in order to keep the insulating properties of the second electrically conductive parts 56, an upper layer thereof was coated with epoxy resin by spin coating, and an insulating layer 57 was formed.

Thus, according to the embodiment 4, by carrying out certain operations repetitively, it is possible to form multilayered interconnections having a structure in which plural layers of interconnection members each layer according to the embodiment of the present invention are laminated via an insulating film(s). In this case, it is possible to form multilayered interconnections that are finer and more reliable with a smaller number of processes than the related art. It is noted that according to the embodiment 4, the multilayered interconnections have two layers. However, multilayered interconnections according to an embodiment of the present invention are not limited to those of two layers. It is possible to further laminate via insulating layer(s) plural layers each having a wettability changing layer and electrically conductive parts in a way the same as or similar to the embodiment 4.

Embodiment 5

In an embodiment 5 of the present invention, an electronic device was manufactured.

Figure 14:
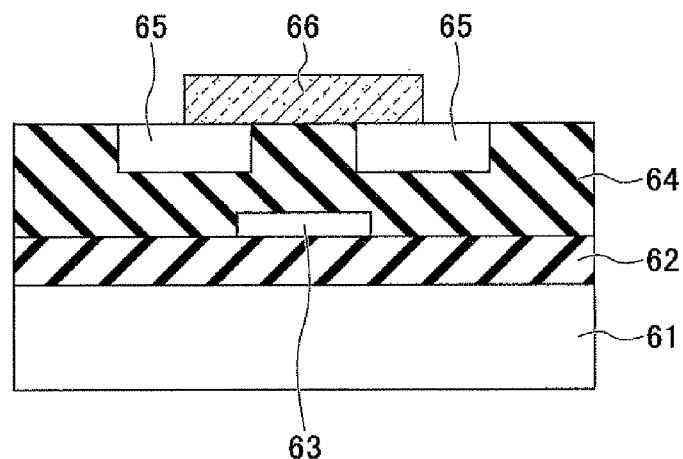
FIG. 14 is a sectional view of a thin film transistor according to an embodiment 5 of the present invention.

As an electronic device, in the embodiment 5, a thin film transistor was manufactured, as will be described below. The thus obtained thin film transistor has, as shown in FIG. 14, a semiconductor layer 66, an insulating film (wettability changing layer) 64, and electrically conductive parts 63 and 65 that are formed according to the embodiment of the present invention.

First, on a film substrate 61 on which wet cleaning had been carried out, a wettability changing layer 62 having a film thickness of 50 nm was formed by the same procedure as that of the embodiment 4 using a thermosetting polyimide NMP solution having hydrophobic groups in side chains as a raw material.

Next, via a photo mask, ultraviolet rays of a wavelength less than or equal to 300 nm were irradiated (by a super-high pressure mercury lamp) in such a manner that the irradiation amount was 8 J/cm², and a high surface energy part was formed on the wettability changing layer 62.

Further, using an inkjet method, the high surface energy part was coated with an electrically conductive ink (nano metal ink), the same as or similar to that of the embodiment 1, in which Ag particles had been dispersed in a water-based solvent. This was then fired at 180° C., and a gate electrode 63 having an electrode width of 50 μm and a film thickness of 100 nm was formed. After thereon a polyimide NMP solution the same as or similar to that of the embodiment 1 was coated with by a spin coating method, firing was carried out at 180° C., and the wettability changing layer 64 having a thickness of 700 nm was formed. The wettability changing layer 64 would also be used as a gate insulting film.

Next, in a laser ablation method using laser light of quadrupled frequency (wavelength: 266 nm) of a YAG laser, depression parts having the same shapes as those of source and drain electrodes 65 were formed. At this time, in order that a channel width would be 5 μm, a separation between the depression parts corresponding to the source and drain electrodes 65 was made to be 5 μm and the depth thereof was made to be 150 nm.

Then, using an inkjet method, the depression parts were selectively coated with an electrically conductive ink (nano metal ink), the same as or similar to that of the embodiment 1, in which Ag particles had been dispersed in a water-based solvent. After that, pre-baking and post-baking were carried out in conditions the same as or similar to those of the embodiment 1, and the source and drain electrodes 65 having a film thickness of 130 nm were formed.

Next, a coating liquid in which triarylamine (organic semiconductor material) expressed by the following structural formula (2) had been dissolved in a xylene/mesitylene mixed solvent and was dropped onto the channel part by an ink jet method, and drying was carried out at 120° C.

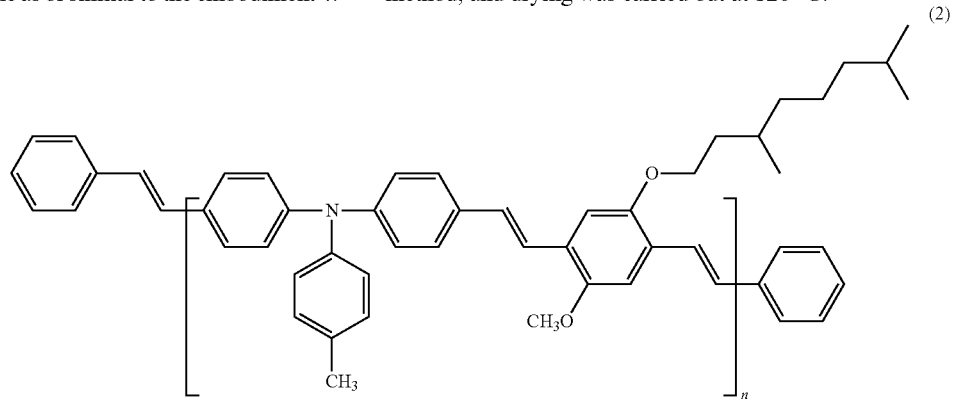

(2)

Thereby, the organic semiconductor layer 66 having a film thickness of 30 nm was formed, and thus, an organic transistor was manufactured. At this time, the wettability changing layer 64 acts as the gate insulating film. Further, the channel part is the low surface energy part of the wettability changing layer 64, and therefore, does not absorb moisture or the like. Therefore, it is possible to provide an interface satisfactory for the characteristics of the thin film transistor. Further, since it is possible to form the source and drain electrodes 65 on approximately the same plane as the gate insulating film surface, printing control carried out when the semiconductor layer 66 is formed becomes easier, and electrically connecting with the source and drain electrodes 65 can be easily carried out.

When the characteristics of the transistor manufactured in the embodiment 5 were evaluated, the organic transistor was obtained in which the patterning properties of the electrodes were satisfactory, the on/off ratio had five digits, and the field-effect mobility was $5 \times 10^{-3}$ cm$^2$/Vs.

Thus, according to the embodiment 5, it is possible to form the wettability changing layer 64 also used as the gate insulting film and the source and drain electrodes 65 by a printing method such as spin coating or inkjet. Therefore, it is possible to form a fine electronic device at low cost. Further, it is possible to form a fine electronic device in which there is no leak between the gate electrode and the source and drain electrodes, a sufficiently high on/off ratio is obtained, and the channel length and the transistor pitch are small.

According to the embodiment 5, as the semiconductor layer, the high polymer organic semiconductor material expressed by the above-mentioned structural formula (2) was used. However, it is also possible to use an inorganic semiconductor such as Si, an oxide semiconductor, carbon nanotubes and so forth, a low-molecular-weight organic semiconductor such as pentacene, anthracene, tetracene, α-6-thiophene, phthalocyanine and derivatives thereof, rubrene and derivatives thereof, perylene and derivatives thereof and so forth, a high-molecular-weight organic semiconductor such as polythiophene and derivatives thereof, polyacetylene-based conductive polymers, polyparaphenylene and derivatives thereof, polyphenylenevinylene and derivatives thereof, polypyrrole and derivatives thereof, polyfluorene and derivatives thereof and so forth may be used. Especially, an organic semiconductor is suitable for an interconnection process manufactured using printing, and is preferable since it is possible to form an electronic device at low cost in a low temperature process.

It is noted that in the embodiment 5, only electrodes of a thin film transistor are manufactured in a manufacturing method according to the embodiment of the present invention. However, an electronic device according to an embodiment of the present invention is not limited thereto, and for example, as described above for the embodiments 1 through 4, it is possible to further form interconnections and/or the like on the same substrate.

Embodiment 6

Figure 15:
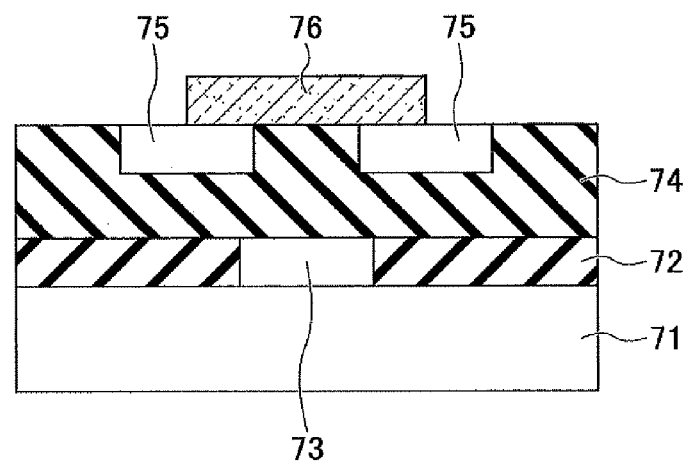
FIG. 15 is a sectional view of a thin film transistor according to an embodiment 6 of the present invention.

In an embodiment 6 of the present invention, as in the embodiment 5 described above, an electronic device was manufactured in a manufacturing method according to the embodiment of the present invention. Specifically, a thin film transistor was manufactured. FIG. 15 schematically shows the thin film transistor.

First, on a film substrate 71 on which wet cleaning had been carried out, a first wettability changing layer 72 having a film thickness of 100 nm using a thermosetting polyimide NMP solution having hydrophobic groups in side chains as a raw material, in a procedure the same as or similar to that of the embodiment 4. At this time, the surface of the first wettability changing layer 72 had low surface energy by the polyimide having the hydrophobic side chains.

Next, at a part corresponding to a pattern of a gate electrode 73 in the wettability changing layer 72, in a laser ablation method using laser light of quadrupled frequency (wavelength: 266 nm) of a YAG laser, a depression part having a width of 20 μm and a depth of 100 nm was formed. The area at which the laser light had not been irradiated was a low surface energy area due by the hydrophobic side chains of the polyimide.

Next, using an inkjet method, the depression part was selectively coated with an electrically conductive ink (nano metal ink), the same as or similar to that of the embodiment 1, in which Ag particles had been dispersed in a water-based solvent. After that, pre-baking and post-baking were carried out in conditions the same as or similar to those of the embodiment 1, and the gate electrode 73 having an electrode width 20 μm and a film thickness of 100 nm was formed.

Further, on the first wettability changing layer 72 and the gate electrode 73, a second wettability changing layer 74 having a thickness of 700 nm was formed in a procedure the same as or similar to that of the embodiment 1. The second wettability changing layer 74 would be also used as a gate insulating film.

Then, in a procedure the same or similar to that of the case of the gate electrode 73, depression parts, having the same shapes as those of source and drain electrodes 75, having a channel width of 5 μm and a depth of 150 nm, were formed in the second wettability changing layer 74. Further, by an inkjet method, in a way the same as or similar to that of the case of the gate electrode 73, an electrically conductive ink (nano metal ink) was coated with, firing was carried out, and the source and drain electrodes 75, having a film thickness of 130 nm and a channel length of 5 μm, were formed.

Next, in a way the same as or similar to that of the embodiment 5, an organic semiconductor layer 76 was formed at the channel part, and thus, an organic transistor was manufactured.

When the characteristics of the transistor manufactured in the embodiment 6 were evaluated, the organic transistor was obtained in which the patterning properties of the electrodes were satisfactory, the on/off ratio had six digits, and the field-effect mobility was $5 \times 10^{-3}$ cm$^2$/Vs.

Thus, according to the embodiment 6, it is possible to form a fine electronic device at low cost using a printing method such as spin coating or inkjet. Further, while taking advantage of the small number of processes thanks to applying printing, it is possible to form a fine electronic device in which there is no leak between the gate electrode and the source and drain electrodes, a sufficiently high on/off ratio is obtained, and the channel length and the transistor pitch are small.

It is noted that here, as the semiconductor layer, the high polymer organic semiconductor material expressed by the above-mentioned structural formula (2) was used. However, it is also possible to use the various semiconductor materials shown in the description of the embodiment 5.

Further, as in the embodiment 6, it is preferable to form all of a gate electrode, a source electrode and a drain electrode in a manufacturing method according to the embodiment of the present invention. However, an electronic device according to an embodiment of the present invention is not limited thereto. In a thin film transistor in which at least one or more of the above-mentioned three electrodes is(are) formed in a method of manufacturing an electrically conductive pattern according to the embodiment of the present invention, a certain advantage is expected such that defects in the insulating properties between electrodes can be reduced or the like. This can be also seen from the example in the embodiment 5, for example.

Embodiment 7

In an embodiment 7 of the present invention, an electronic device array was manufactured in which plural of the electronic devices (thin film transistors) manufactured in the embodiment 6 or the like were disposed along the substrate.

Figure 16A:
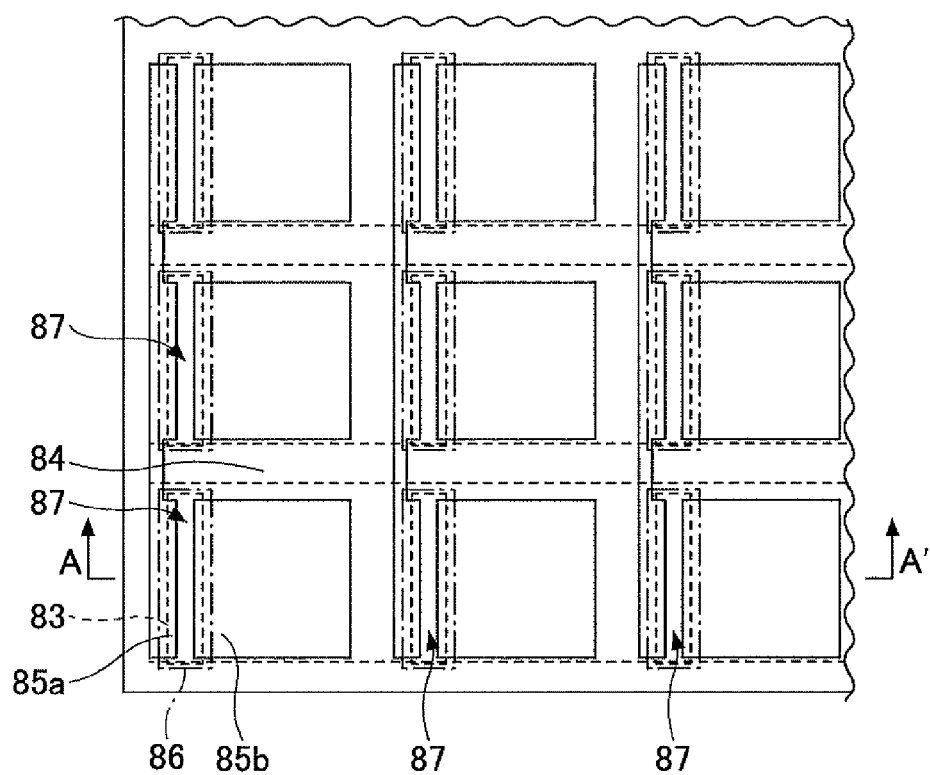
FIGS. 16A and 16B illustrate an electronic device array according to an embodiment 7 of the present invention.
Figure 16B:
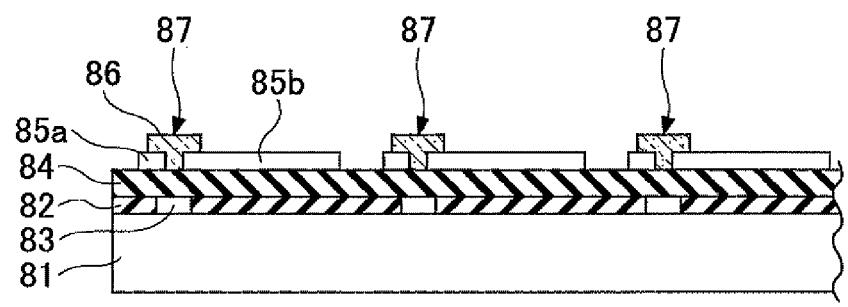

FIGS. 16A and 16B schematically show an electronic device array according to the embodiment 7. FIG. 16A shows a plan view of the electronic device array and FIG. 16B shows a sectional view of the electronic device array. It is noted that FIG. 16B shows a sectional view taken along an A-A' line of FIG. 16A. Further, in order to show an arrangement of respective parts, gate electrodes 83 are also indicated by broken lines in FIG. 16A.

As an electronic device array according to the embodiment 7, specifically, an electronic device array was manufactured in which 200 by 200 (200×200) (pitch between devices: 127 μm) of organic transistors 87 are disposed to form a two-dimensional array on a substrate 81. The average value of the field-effect mobility of the plural organic transistors 87 was $5 \times 10^{-3}$ cm$^2$/Vs.

Thus, according to the embodiment 7, it is possible to form gate electrodes, wettability changing layers also used as gate insulating films, source and drain electrodes and/or the like by a printing method of spin coating or inkjet. Therefore, it is possible to form a fine electronic device array at low cost. Further, also in the embodiment 7, it is possible to form a fine electronic device array having high reliability in which there is no leak between the gate electrode and the source and drain electrodes, a sufficiently high on/off ratio is obtained, and the channel length and the transistor pitch are small.

It is noted that in FIGS. 16A and 16B, the reference numeral 81 denotes a substrate corresponding to the substrate 71 shown in FIG. 15; the reference numeral 82 denotes a wettability changing layer corresponding to the wettability changing layer 72 shown in FIG. 15; the reference numeral 83 denotes the gate electrodes corresponding to the gate electrode 73 shown in FIG. 15; the reference numeral 84 denotes a second wettability changing layer corresponding to the second wettability changing layer 74 shown in FIG. 15; the reference numerals 85a and 85b denote source and drain electrodes corresponding to the source and drain electrodes 75 shown in FIG. 15; and the reference numeral 86 denotes organic semiconductor layers corresponding to the organic semiconductor layer 76 shown in FIG. 15.

Figure 16C:
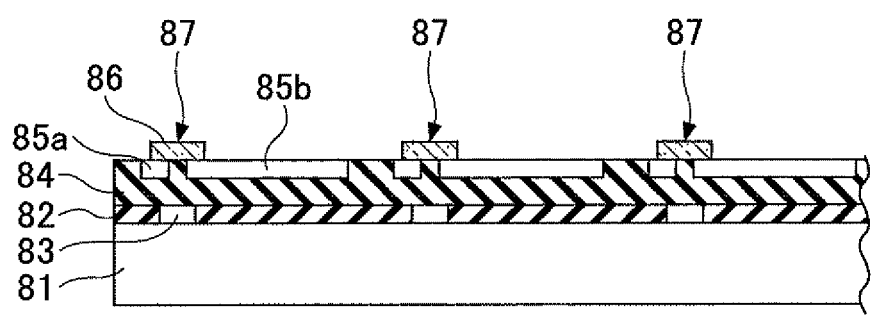
FIG. 16C shows a sectional view of an electronic device array according to a variant embodiment of the embodiment 7.

Further, it is noted that in FIG. 16B, the structure of each of the electronic devices included in the electronic device array is different from the structure of the electronic device shown in FIG. 15 in that the source and drain electrodes 85a and 85b are not formed in the second wettability changing layer 84 but are formed on the second wettability changing layer 84. However, it can be clearly seen that the structure according to the embodiment 7 may be modified to more precisely correspond to the structure according to the embodiment 6 of FIG. 15 so that the source and drain electrodes 85a and 85b may be formed in the second wettability changing layer 84 as shown in FIG. 16C as the source and drain electrodes 75 are formed in the second wettability changing layer 74 as shown in FIG. 15. FIG. 16C corresponds to FIG. 16B and shows a variant embodiment of the embodiment 7 in which the structure of each of the electronic devices included in the electronic device array more precisely corresponds to the structure of the electronic device of FIG. 15.

Embodiment 8

In an embodiment 8 of the present invention, a display device was manufactured including the electronic device array manufactured in the embodiment 7 described above of the like.

Figure 17A:
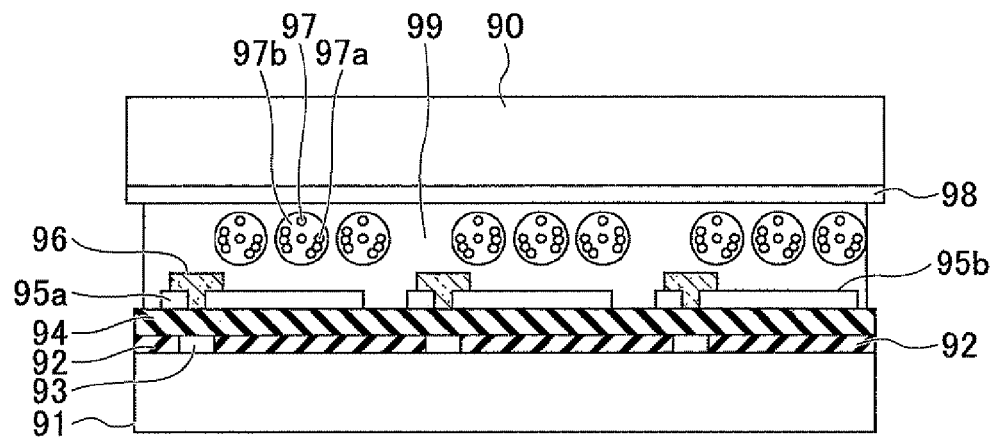
FIG. 17A is a sectional view of a display device according to an embodiment 8 of the present invention.

FIG. 17A schematically shows the display device according to the embodiment 8. First, a coating liquid was prepared in which microcapsules (display elements) 97 and an aqueous solution of polyvinyl alcohol (PVA) were mixed. The microcapsules 97 involved titanium oxide particles 97a and isopar 97b that was colored by oil blue. Then, a transparent electrode 98 made of ITO that was provided on a polycarbonate substrate 90 was coated with the coating liquid. Thus, a substrate was formed having a layer that includes the microcapsules 97 and a PVA binder 99.

The substrate thus obtained in the previous process and the electronic device array manufactured in the embodiment 7 were bonded together in such a manner that the substrate 90 and a substrate 91 (corresponding to the substrate 81 in FIG. 16B or FIG. 16C) become the respective outermost surfaces. Further, a driver IC (not shown) for scanning (moving) signals was connected to bus lines (not shown) connected with gate electrodes 93, and a driver IC (not shown) for data signals was connected to bus lines (not shown) connected with source electrodes 95a. Then, when evaluation was carried out on the thus obtained display device while a screen page displayed by the display device was switched per 0.5 seconds, it was possible to carry out satisfactory displaying of static images.

Thus, by removing certain parts of a wettability changing layer using a laser ablation method and coating with an electrically conducive ink by an inkjet method or the like, it was possible to reduce an increase in the number of processes and form the display device that had a fine structure and had high reliability while taking advantage of the small number of processes achieved thanks to applying printing.

It is noted that in FIG. 17A, the reference numeral 91 denotes the substrate corresponding to the substrate 81 shown in FIG. 16B or 16C; the reference numeral 92 denotes a wettability changing layer corresponding to the wettability changing layer 82 shown in FIG. 16B or 16C; the reference numeral 93 denotes the gate electrodes corresponding to the gate electrode 83 shown in FIGS. 16A and 16B or 16C; the reference numeral 94 denotes a second wettability changing layer corresponding to the second wettability changing layer 84 shown FIGS. 16A and 16B or 16C; the reference numeral 95a denotes the source electrodes corresponding to the source electrodes 85a shown in FIGS. 16A and 16B or 16C; and the reference numeral 96 denotes organic semiconductor layers corresponding to the organic semiconductor layer 86 shown in FIGS. 16A and 16B or 16C.

Figure 17B:
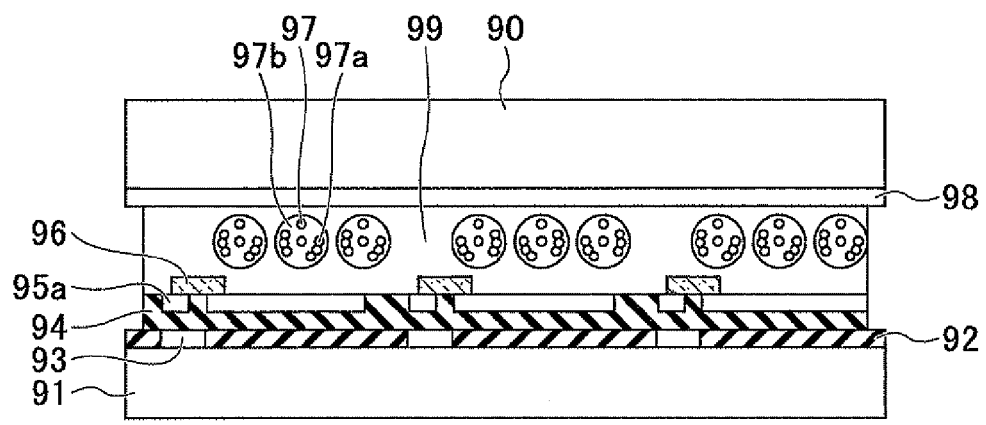
FIG. 17B shows a sectional view of a display device according to a variant embodiment of the embodiment 8.

Further, it is noted that in FIG. 17A, the structure of the electronic device array included in the display device is different from the structure of the electronic device array shown in FIG. 16C. However, it can be clearly seen that the structure according to the embodiment 8 may be modified to more precisely correspond to the structure according to the embodiment 7 of FIG. 16C. FIG. 17B corresponds to FIG. 17A and shows a variant embodiment of the embodiment 8 in which the structure of the electronic devices included in the display device more precisely corresponds to the structure of the electronic device array of FIG. 16C.

The present invention is not limited to the specifically disclosed embodiments, and variations and modifications may be made without departing from the scope of the present invention.

The present application is based on Japanese Priority Patent Application No. 2011-129489 filed Jun. 9, 2011 and Japanese Priority Patent Application No. 2012-023116 filed Feb. 6, 2012, the entire contents of which are hereby incorporated herein by reference.

What is claimed is:

1. A method of manufacturing an interconnection member, comprising:
   forming on a substrate a wettability changing layer containing a material in which critical surface tension is changed by giving energy;
   forming a depression part in the wettability changing layer by a laser ablation method using a laser of an ultraviolet region; and
   coating the depression part with an electrically conductive ink to form an electrically conductive part, wherein
   at the same time when a pattern of the depression part is formed in the wettability changing layer, a pattern of a high surface energy area is formed as a result of the critical surface tension being changed.

2. The method of manufacturing an interconnection member as claimed in claim 1, wherein
   the laser of the ultraviolet region is a YAG laser of a tripled or quadrupled frequency or an excimer laser.

3. The method of manufacturing an interconnection member as claimed in claim 1, wherein
   in the forming the depression part in the wettability changing layer by the laser ablation method using the laser of the ultraviolet region, a galvano scanner is used to carry out scanning with a laser beam and form the depression part in the wettability changing layer.

4. The method of manufacturing an interconnection member as claimed in claim 1, wherein
   in the coating the depression part with the electrically conductive ink to form the electrically conductive part, an inkjet method or a nozzle-printing method is used to coat the depression part with the electrically conductive ink.

5. The method of manufacturing an interconnection member as claimed in claim 1, wherein a length of the depression part is equal to a length of the high surface energy area.

* * * * *